US012628629B2

(12) United States Patent
Singh et al.

(10) Patent No.: US 12,628,629 B2
(45) Date of Patent: May 12, 2026

(54) VIA OPENING RECTIFICATION USING LAMELLAR TRIBLOCK COPOLYMER, POLYMER NANOCOMPOSITE, OR MIXED EPITAXY

(71) Applicant: Intel Corporation, Santa Clara, CA (US)

(72) Inventors: Gurpreet Singh, Portland, OR (US); Florian Gstrein, Portland, OR (US); Eungnak Han, Portland, OR (US); Marie Krysak, Portland, OR (US); Tayseer Mahdi, Beaverton, OR (US); Xuanxuan Chen, Hillsboro, OR (US); Brandon Jay Holybee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 318 days.

(21) Appl. No.: 17/511,693

(22) Filed: Oct. 27, 2021

(65) Prior Publication Data

US 2022/0199462 A1      Jun. 23, 2022

Related U.S. Application Data

(60) Provisional application No. 63/128,264, filed on Dec. 21, 2020.

(51) Int. Cl.
*H01L 21/768* (2006.01)
*H01L 23/522* (2006.01)
*H01L 23/532* (2006.01)

(52) U.S. Cl.
CPC .... *H01L 21/76802* (2013.01); *H01L 23/5226* (2013.01); *H01L 23/5329* (2013.01)

(58) Field of Classification Search
CPC ........... H01L 21/76802; H01L 23/5226; H01L 23/5329; H01L 21/0271; H01L 21/76816
See application file for complete search history.

(56) References Cited

U.S. PATENT DOCUMENTS

2009/0087664 A1    4/2009  Nealey et al.
2014/0127456 A1    5/2014  Regner
(Continued)

FOREIGN PATENT DOCUMENTS

JP          2009255497 A    11/2009
JP          2010522643 A     7/2010
(Continued)

OTHER PUBLICATIONS

Extended European Search Report in EP Application 21208872.8 dated Aug. 3, 2022, 9 pages.

*Primary Examiner* — Patricia D Valenzuela
(74) *Attorney, Agent, or Firm* — Akona IP PC

(57)          ABSTRACT

Methods for forming via openings by using a lamellar triblock copolymer, a polymer nanocomposite, and a mixed epitaxy approach are disclosed. An example method includes forming a guiding pattern (e.g., a topographical guiding pattern, chemical guiding pattern, or mixed guiding pattern) on a surface of a layer of an IC device, forming lamellar structures based on the guiding pattern by using the lamellar triblock copolymer or forming cylindrical structures based on the guiding pattern by using the polymer nanocomposite, and forming via openings by removing a lamella from each of at least some of the lamellar structures or removing a nanoparticle from each of at least some of the cylindrical structures.

10 Claims, 20 Drawing Sheets

400

(56)     References Cited

U.S. PATENT DOCUMENTS

2018/0323104  A1 *   11/2018   Younkin  ........... H01L 23/53295
2020/0066629  A1 *    2/2020   Schenker  ............ H01L 21/3086

FOREIGN PATENT DOCUMENTS

JP          2013183014  A       9/2013
JP          2020515029  A       5/2020
WO          2018125089  A1      7/2018
WO          2019190463  A1     10/2019

* cited by examiner

100

110

120

110

130

160

150

140

170

X

Y

Z

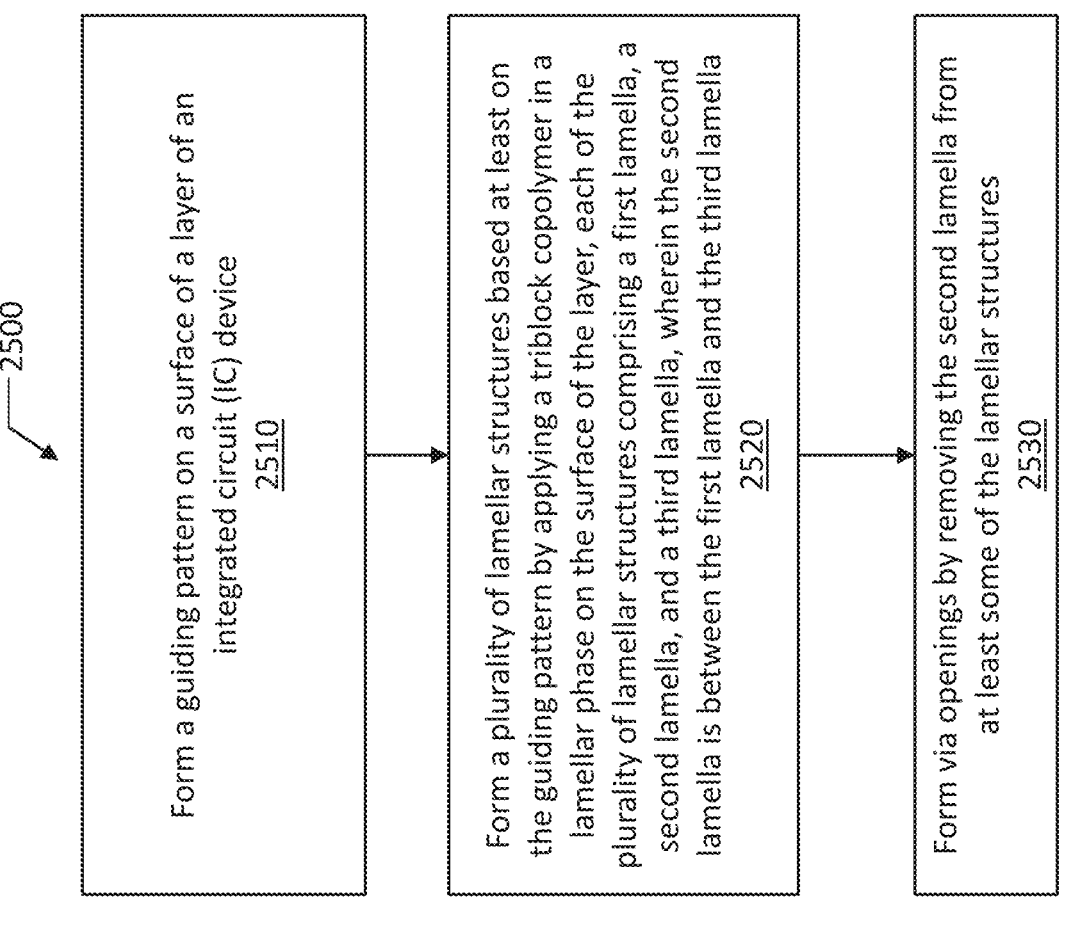

2500

Form a guiding pattern on a surface of a layer of an integrated circuit (IC) device
2510

Form a plurality of lamellar structures based at least on the guiding pattern by applying a triblock copolymer in a lamellar phase on the surface of the layer, each of the plurality of lamellar structures comprising a first lamella, a second lamella, and a third lamella, wherein the second lamella is between the first lamella and the third lamella
2520

Form via openings by removing the second lamella from at least some of the lamellar structures
2530

FIG. 25

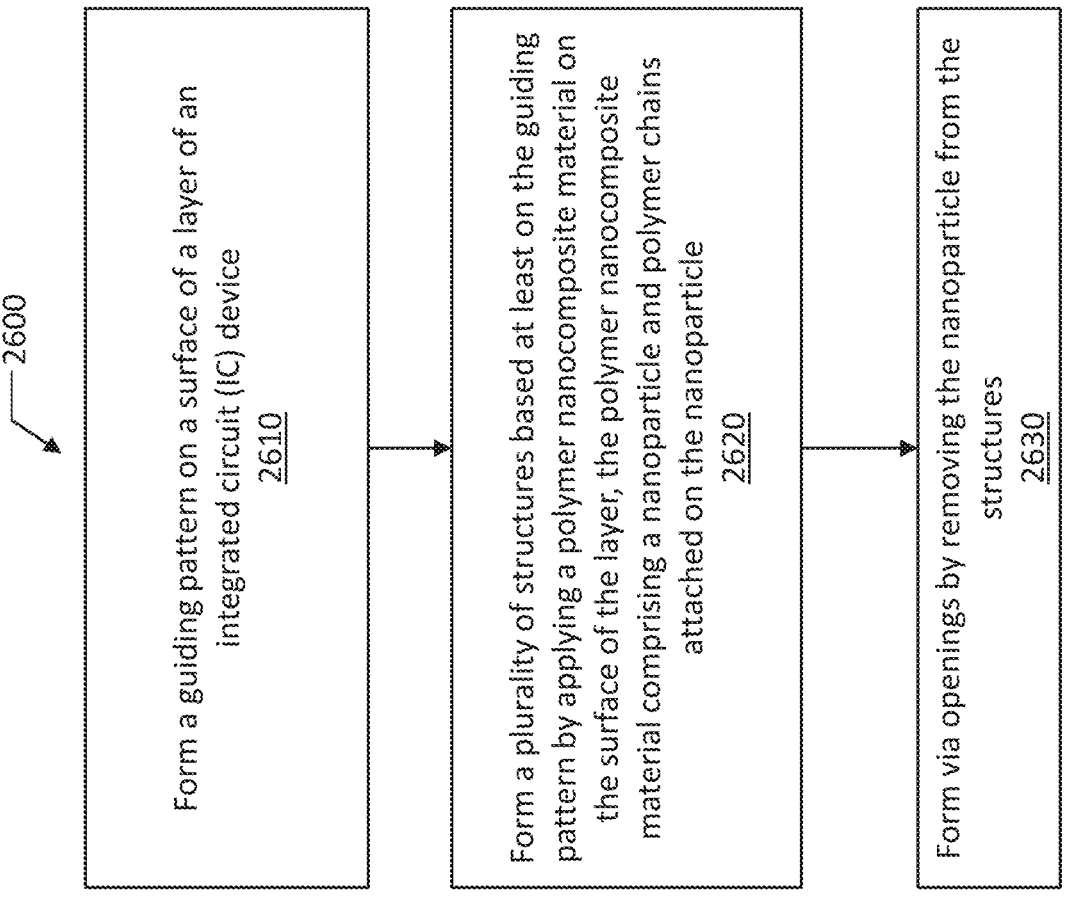

2600

Form a guiding pattern on a surface of a layer of an integrated circuit (IC) device
2610

Form a plurality of structures based at least on the guiding pattern by applying a polymer nanocomposite material on the surface of the layer, the polymer nanocomposite material comprising a nanoparticle and polymer chains attached on the nanoparticle
2620

Form via openings by removing the nanoparticle from the structures
2630

FIG. 26

VIA OPENING RECTIFICATION USING LAMELLAR TRIBLOCK COPOLYMER, POLYMER NANOCOMPOSITE, OR MIXED EPITAXY

CROSS REFERENCE TO RELATED APPLICATION

This application claims the benefit of U.S. Provisional Patent Application No. 63/128,264, filed Dec. 21, 2020, which is incorporated by reference its entirety.

TECHNICAL FIELD

This disclosure relates generally to semiconductor devices, and more specifically, to via opening of semiconductor devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 25 is a flowchart illustrating a process of using a lamellar triblock copolymer to rectify via openings, in accordance with various embodiments.

FIG. 26 is a flowchart illustrating a process of using a polymer nanocomposite to rectify via openings, in accordance with various embodiments.

DETAILED DESCRIPTION

Overview

Figures 1A, 1B:
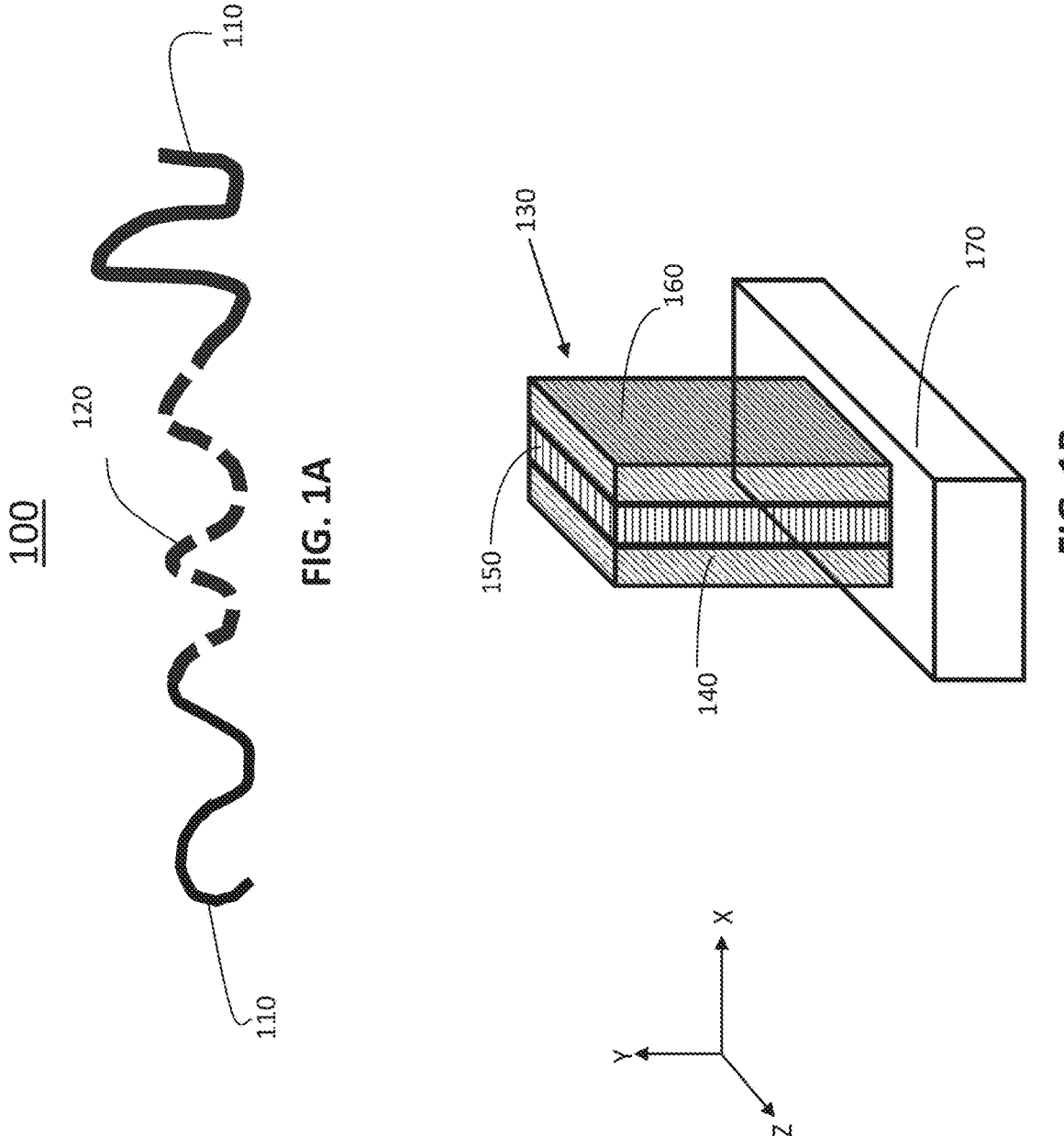
FIGS. 1A-1B illustrates a triblock copolymer in lamellar phase, in accordance with some embodiments.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed to form an opening in the photoresist layer. Next, an opening for the via may be etched in the dielectric layer by using the opening in the photoresist layer as an etch mask. This opening is referred to as a via opening. An example via opening is a contact hole. Finally, the via opening may be filled with one or more metals or other conductive materials to form the via. The via may be a plating through via, blind via (e.g., a via connecting the outermost circuit of a printed circuit board (PCB) and the adjacent inner layer), buried via (e.g., a via connecting circuit layers of a PCB but not passing to the outer layer of the PCB), or other types of vias.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension (e.g., a diameter or some other transverse cross-sectional dimension) of the via opening. One measure of the spacing of the vias is the via pitch, representing the center-to-center distance between the closest adjacent vias.

When patterning extremely small vias with extremely small pitches by such lithographic processes, several challenges present themselves. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment.

Another such challenge is that the critical dimensions of the via openings generally tend to scale faster than the resolution capabilities of the lithographic scanners. Via opening rectification technologies exist to reduce the critical dimensions of the via openings. However, the reduced amount tends to be limited by the minimum via pitch, as well as by the ability of the via opening rectification process to be sufficiently optical proximity correction (OPC) neutral, and to not significantly compromise line width roughness (LWR) and/or critical dimension uniformity (CDU). Yet another such challenge is that the LWR and/or CDU characteristics of photoresists generally need to improve as the critical dimensions of the via openings decrease to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners. Even though EUV defined via openings offer a lot of design flexibility and helps save number of masks, EUV defined via openings show a lot of variability in LWR and/or CDU due to stochastic nature of the process. The variability increases with decreasing critical dimensions. Additionally, the via opening critical dimensions needed are beyond what EUV can do currently.

Present state of the art method to reduce the critical dimension of EUV holes is to print a relatively large hole and then taper it down to final dimension using etch. Any variability in the starting hole dimension persists post taper and, in some cases, results in missing holes. DSA based via opening rectification approach has been used to scale the CD to final dimension without etch tapering as well as reduce the variation in CD. DSA based via opening rectification has been demonstrated in the past using cylindrical diblock copolymers. Cylindrical diblock copolymers form cylinders (or holes) but fail to form elongated via openings. One problem with the cylindrical structure is that it restricts design flexibility. The other problem is that diblock copolymers are not able to rectify variations in CD nonuniformity as well due to limitations in their flexibility (expansion and contraction). As a result, the variations are not rectified enough.

Therefore, improved technology for rectifying via openings is needed.

Embodiments of the present invention relate to an IC device that includes a first layer and a second layer. The second layer adjoins the first layer. The second layer includes lamellar structures. An individual lamellar structure includes a via between two lamellae. The two lamellae are electrically insulating, and the via includes an electrically conductive material. The two lamellae may be two different blocks of a triblock copolymer. The two lamellae may include the same polymer. The via includes a conductive material. The via may be a through via, a blind via, or a buried via. In some embodiments, the first layer includes a grating pattern, which is an alternative pattern of first section and second sections. The second sections include a different material from the first section. The via is in a portion of the second layer that adjoins a first section of the first layer.

Embodiments of the present invention also relate to rectifying via openings by using triblock copolymers that form lamellar phase ("lamellar triblock copolymers"). Compared with diblock copolymers, lamellar triblock copolymers show a higher degree of flexibility in terms of compression and expansion. Also, lamellar triblock copolymers can form elongated via openings that are desirable for IC devices. Compared with diblock copolymers, lamellar triblock copolymers show a much wider process window for incoming pattern variations and can rectify via openings with a large variation in the CD. Additionally, lamellar triblock copolymers offer much more flexibility in terms of via opening shape and size. In various embodiments, a triblock copolymer molecule includes two blocks of a first polymer and a block of a second polymer that is different from the first polymer. The block of the second polymer is between the blocks of the first polymer. The lamellar phase of the triblock copolymer molecule includes three lamellae: two lamellae of the first polymer and a lamella of the second polymer between the two lamellae of the first polymer. The lamellar triblock copolymer may be self-assembled on a surface of a semiconductor layer and elongates in a direction perpendicular to the surface of the semiconductor layer. The self-assembly of the lamellar triblock copolymer may be based on graphoepitaxy, chemoepitaxy, or a combination of both. The lamella of the second polymer can be removed from the lamellar triblock copolymer to form via openings. The dimensions of the via openings are based at least in part on the dimensions of the lamella of the second polymer. In some embodiments, the first polymer is more rigid than the second polymer to control uniformity of the dimensions of the via openings. Via openings rectified by using such a lamellar triblock copolymer can have better CDU, compared with via openings rectified by using diblock copolymers.

Further embodiments of the present invention relate to rectifying via openings by using polymer nanocomposites. In various embodiments, a polymer nanocomposite molecule includes a nanoparticle and a polymer (e.g., a block copolymer). The polymer chain is attached to the nanoparticle. The nanoparticle may be surrounded by the polymer in multiple dimensions. An embodiment of the polymer nanocomposite forms a cylindrical phase, in which the nanoparticle is a cylinder, and the polymer is a hollow cylinder enclosing the nanoparticle cylinder. The nanoparticle cylinder may be removed from the polymer nanocomposite molecules to form via openings. As the dimensions of the via openings are based on the dimensions of the nanoparticle, the via openings can have the same or similar dimensions as long as the dimensions of the nanoparticles of the polymer nanocomposite molecules are consistent. Accordingly, the via openings can be independent of CD variations and can give one CD distribution. The shape of the polymer defines the CD.

Further embodiments of the present invention relate to rectifying via openings by using a mixed epitaxy approach. The mixed epitaxy approach is a combination of graphoepitaxy and chemoepitaxy. In some embodiments, graphoepitaxy is used to form a topographical guiding pattern that includes walls and openings between the walls. Further, chemoepitaxy is used to form a chemical guiding pattern in an individual opening. Accordingly, the mixed epitaxy approach provides a mixed guiding pattern that include the topographical guiding pattern and chemical guiding patterns within the topographical guiding pattern. The mixed guiding pattern may be used for DSA of diblock copolymers, triblock copolymers, or polymer nanocomposites. Such an approach may rectify any EPE (edge placement error) that may occur during the placement of the vias and can steer the vias to the desired via design. Compared with via opening rectification that is based on graphoepitaxy alone, the mixed epitaxy approach can have a much wider process window and can tolerate and rectify much larger variations in the CD nonuniformity of the via openings. This approach can also offer more flexibility in via opening design.

Various IC devices with one or more via openings rectified by using a lamellar triblock copolymer, a polymer nanocomposite, or mixed epitaxy as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on an IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

In some embodiments, via openings rectified by using a lamellar triblock copolymer, a polymer nanocomposite, or mixed epitaxy as described herein may be used to form conductive vias of a metallization stack of an IC device. A term "metallization stack" (also sometimes referred to as an "interconnect stack") may be used to refer to a stack of one or more interconnects for providing connectivity to different circuit components of an IC chip. A term "interconnect" may be used to describe any element formed of an electrically conductive material for providing electrical connectivity to one or more components associated with an IC or/and between various such components. In general, the "interconnect" may refer to both conductive lines/wires (also sometimes referred to as "lines" or "metal lines" or "trenches") and conductive vias (also sometimes referred to as "vias" or "metal vias"). In general, the term "conductive line" may be used to describe an electrically conductive element isolated by a dielectric material typically comprising an interlayer low-k dielectric that is provided within the plane of an IC chip. Such conductive lines are typically stacked into several levels, or several layers of metallization stacks. On the other hand, the term "conductive via" may be used to describe an electrically conductive element that interconnects two or more trench contacts of different levels. To that end, a via may be provided substantially perpendicularly to the plane of an IC chip and may interconnect two conductive lines in adjacent levels or two conductive lines in not adjacent levels.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

The drawings are intended to show relative arrangements of the elements therein, and the device assemblies of these figures may include other elements that are not specifically illustrated (e.g., various interfacial layers). Similarly, although particular arrangements of materials are discussed with reference to the drawings, intermediate materials may be included in the devices and assemblies of these drawings. Still further, although some elements of the various device views are illustrated in the drawings as being planar rectangles or formed of rectangular solids and although some schematic illustrations of example structures are shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, or inspection of a cross-section of a device to detect the shape and the location of various device elements described herein using, e.g., physical failure analysis (PFA) would allow determination of presence of one or more transistor arrangements fabricated using a placeholder for backside contact formation as described herein.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, some descriptions may refer to a particular source or drain region or contact being either a source region/contact or a drain region/contact. However, unless specified otherwise, which region/contact of a transistor is considered to be a source region/contact and which region/contact is considered to be a drain region/contact is not important because under certain operating conditions, designations of source and drain are often interchangeable. Therefore, descriptions provided herein may use the term of a "S/D region/contact" to indicate that the region/contact can be either a source region/contact, or a drain region/contact.

In another example, if used, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials.

In another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

In yet another example, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−5-20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

In addition, the terms "comprise," "comprising," "include," "including," "have," "having" or any other variation thereof, are intended to cover a non-exclusive inclusion. For example, a method, process, device, or system that comprises a list of elements is not necessarily limited to only those elements but may include other elements not expressly listed or inherent to such method, process, device, or system. Also, the term "or" refers to an inclusive "or" and not to an exclusive "or."

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

Example Lamellar Triblock Copolymer

FIGS. 1A-1B illustrates a triblock copolymer in lamellar phase, in accordance with some embodiments. The triblock copolymer in lamellar phase is also referred to as a lamellar triblock copolymer. The lamellar triblock copolymer can be used to rectify via openings (such as contact holes) through DSA based on graphoepitaxy, chemoepitaxy, or mixed epitaxy. FIG. 1A shows a molecule 100 of the triblock copolymer ("triblock copolymer molecule 100"), in accordance with some embodiments. FIG. 1B shows a lamellar structure 130 of the triblock copolymer, in accordance with some embodiments.

The triblock copolymer molecule 100 is a polymeric molecule formed of a chain of covalently bonded monomers. In the triblock copolymer, there are at least two different types of monomers, and these different types of monomers are primarily included within different blocks or contiguous sequences of monomers. As shown in FIG. 1, the triblock copolymer molecule 100 includes two blocks of polymer A 110 and a block of polymer B 120. The block of polymer B 120 is between the two blocks of polymer A 110. The block of polymer A 110 and the block of polymer B 120 are covalently bonded together. The block of polymer A and the block of polymer B may be of approximately equal length, or one block may be significantly longer than the other. An individual block of polymer A 110 includes predominantly a chain of covalently linked monomer A (e.g., A-A-A-A-A . . . ), whereas the block of polymer B 120 includes predominantly a chain of covalently linked monomer B (e.g., B-B-B-B-B . . . ). The monomers A and B may represent any of the different types of monomers used in block copolymers known in the arts. Examples of the polymer A 110 and polymer B 120 include polyethylene, polystyrene, polyvinylchloride, polytetrafluorethylene, polydimethylsiloxane, some polyesters, some polyurethanes, acrylics, epoxies, P(t-Butyl Acrylate), polyacrylic acid, polyacrylamide, maleic anhydride polymers, polyethylene, polypropylene, polyacrylonitrile, polybutadiene, polyvinyl acetate, polyacetic acid, polybutyl acrylate, polylactic acid, polycaprolactone, poly(ethylene glycol), polyisoprene, and so on. In other embodiments, the polymer A 110 or polymer B 120 may be other polymers.

Even though the triblock copolymer molecule 100 in FIG. 1A includes two blocks of polymer A 110 and a block of polymer B 120, other embodiments of the triblock copolymer molecule 100 may include a block of polymer A 110, a block of polymer B 120, and a block of polymer C, with the block of polymer B 120 between the block of polymer A 110 and the block of polymer C. Polymer C is a different polymer from polymer A 110 and polymer B 120. Also, an individual block may include different types of monomers. For example, the individual block may itself be a copolymer of two or more types of monomers.

In some embodiments, the block of polymer A 110 and the block of polymer B 120 have different chemical properties. As one example, one of the blocks may be relatively more hydrophobic (e.g., water disliking) and the other may be relatively more hydrophilic (water liking). As another example, one of the blocks may be relatively more similar to oil and the other block may be relatively more similar to water. Such differences in chemical properties between the different blocks of polymers, whether a hydrophilic-hydrophobic difference or otherwise, may cause the triblock copolymer molecule 100 to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to separate from each other due to chemical dislike for the other.

However, because the polymer blocks are covalently bonded to one another, they cannot be completely separated on a macroscopic scale. Rather, polymer blocks of a given type may tend to segregate or conglomerate with polymer blocks of the same type of other molecules. Self-assembly of the triblock copolymer molecule 100, whether based on hydrophobic-hydrophilic differences or otherwise, may be used to form extremely small periodic structures (e.g., precisely spaced nanoscale structures). In some embodiments, the triblock copolymer is used to form nanoscale lamellar structures (e.g., a lamellar structure including three lamellae formed from the three polymer blocks) or other nanoscale structures that can be used to rectify via openings. The dimensions of the lamellae are dependent at least in part upon the lengths of the polymer blocks. The triblock copolymer may self-assemble into nanostructures of other shapes, such as hexagonally packed cylinders, body-centered cubic spheres, etc.

In the embodiment of FIG. 1B, self-assembly of the triblock copolymer molecule 100 forms a lamellar structure 130. As will be explained further below, the lamellar structure 130 may be formed by using graphoepitaxy, chemoepitaxy, or mixed epitaxy. The lamellar structure 130 includes two polymer A lamellae 140 and 160 and a polymer B lamella 150. The polymer B lamella 150 is between the two polymer A lamellae 140 and 160. The lamellar structure 130 may be formed in via openings of an IC device to rectify the via openings. The polymer B lamella 150 can be removed to form the rectified via openings in the IC device. Accordingly, the dimensions of the polymer B lamella 150 at least partially define the dimensions of the via openings.

In some embodiments, polymer A 110 and polymer B 120 have different mechanical properties. For example, polymer A 110 are more rigid than polymer B 120. Accordingly, the polymer A lamellae 140 and 160 are more rigid than the polymer B lamella 150. In an embodiment, the polymer A lamellae 140 and 160 of the lamellar structure 130 has a rigidity above a first threshold and the polymer B lamella 150 has a rigidity below a second threshold that is lower than the first threshold. As polymer B 120 is more flexible, the block of polymer B 120 can be more easily stretched or compressed between the blocks of polymer A 110 when the triblock copolymer molecule 110 forms the lamellar structure 130. In an embodiment, the block of polymer B 120 folds onto itself during the self-assembly of the triblock copolymer molecule 110. The higher rigidity of the polymer A lamellae 140 and 160 help ensure a uniform size of the polymer B lamella 150 and consequently, help ensure a uniform size of the rectified via openings. Also, as the polymer B lamella 150 is relatively flexible, the polymer B lamella 150 can be removed through an etching process that does not or barely etch the polymer A lamellae 140 and 160, which further ensures a uniform size of the rectified via openings. Therefore, compared with the method of rectifying via openings with cylindrical deblock copolymer, via opening rectification using lamellar triblock copolymer provides better CDU.

In some embodiments, the lamellar structure 130 is formed on a surface of a layer 170. As shown in FIG. 1B, the lamellar structure 130 has an orientation along the Y axis, which is perpendicular to the surface of the layer 170. The layer 170 may be a semiconductor substrate. In some embodiments, the layer 170 includes a grating pattern, e.g., an alternative pattern of first sections and second sections. The first sections include a different material from the second section. The lamellar structure 130 may be formed in accordance with the grating pattern. More details regarding forming lamellar structure in accordance with a grating pattern is described below in conjunction with FIGS. 16-20.

FIGS. 2-6 illustrate a process of forming via openings 520 by using graphoepitaxy-based DSA of a lamella triblock copolymer, in accordance with some embodiments. An embodiment of the lamella triblock copolymer is the lamellar triblock copolymer described above in conjunction with FIGS. 1A-1B.

Figures 2, 3:
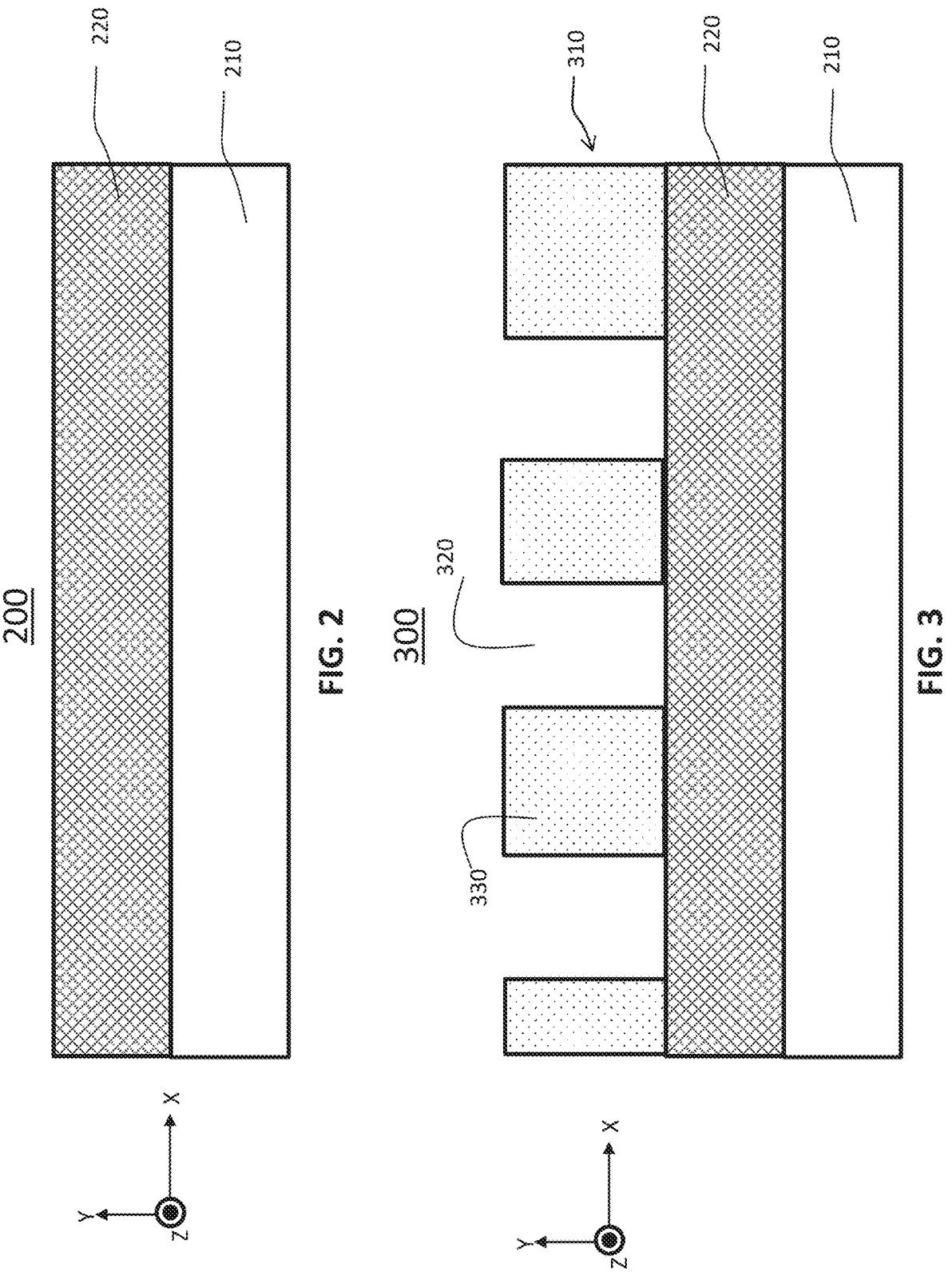
FIGS. 2-6 illustrate a process of forming via openings by using graphoepitaxy-based directed self-assembly (DSA) of a lamella triblock copolymer, in accordance with some embodiments.

FIG. 2 shows an IC device 200 that includes an intermediate layer 220 over (e.g., attached on) a substrate 210. The substrate 210 may include a semiconductor material. Examples of the semiconductor material include, for example, single crystal silicon, polycrystalline silicon, silicon on insulator (SOI), other suitable semiconductor material, or some combination thereof. The substrate 210 may also include other materials, such as metal, dielectric, dopant, and so on. In some embodiments, the substrate 210 may include various IC components, such as transistors, etc. In some embodiments, the substrate 210 is a general workpiece object used to manufacture integrated circuits.

The intermediate layer 220 may include a dielectric or insulating material. Examples of the dielectric material include, for example, oxides of silicon (e.g., silicon dioxide (SiO)), doped oxides of silicon, fluorinated oxides of silicon, carbon doped oxides of silicon, various low-k dielectric materials known in the arts, and combinations thereof. The dielectric layer may be formed by conventional techniques, such as Chemical Vapor Deposition (CVD), Physical Vapor Deposition (PVD), or by other deposition methods. In an embodiment, the intermediate layer 220 includes a grating pattern that guides self-assembly of the lamellar triblock copolymer. More information regarding the grating pattern is described below in conjunction with FIGS. 16-20.

FIG. 3 shows an IC device 300. The IC device 300 is fabricated by forming a guiding pattern layer 310 on the IC device 200, e.g., on a surface of the intermediate layer 220. The guiding pattern layer 310 includes a topographical guiding pattern. The topographical guiding pattern directs self-assembly of the lamellar triblock copolymer. In some embodiments, the topographical guiding pattern directs self-assembly of the lamellar triblock copolymer through mechanisms such as commensurability, lateral ordering, confinement effects, etc.

In FIG. 3, the topographical guiding pattern is an alternative pattern of openings 320 (individually referred to as "opening 320") and guiding walls 330 (individually referred to as "guiding wall 330"). Each opening 320 is between two guiding walls 330 that defines the opening 320. The guiding pattern layer 310 can be formed by using various lithography technologies, such as EUV, immersion lithography (e.g., by using ultraviolet (UV) light at 193 nm wavelength), deep UV lithography (e.g., dry 193 nm photolithography), and so on. An opening 320 may be a via opening. However, due to the technical challenges of the lithographical technologies that are described above, the via openings lack sufficient CDU. The sizes of the via openings may vary more significantly than desired. Therefore, the via openings need to be rectified, e.g., through DSA of the lamellar triblock copolymer.

In some embodiments, the guiding pattern layer 310 may be physically tailored or chemically modified to impose different affinity to different polymer blocks of the lamellar triblock copolymer to enforce the orientation of the lamellar triblock copolymer, which is perpendicular to the intermediate layer 220. In other embodiments, a surface treatment may be performed to modify the guiding pattern layer 310. The surface treatment may make portions of the guiding pattern layer 310 (e.g., surfaces of the openings 320) chemically neutral, or at least relatively more neutral, to different polymer blocks of the triblock copolymer. A non-neutral surface may have a greater interaction tendency (e.g., repulsive or attractive) with one polymer block than with another, then the non-neutral surface would tend to influence the self-assembly of the triblock copolymer in a way that may not be desired. In some embodiments, the surface treatment may be an application of a coating having a chemical property (e.g., a hydrophilic/hydrophobic property) that is intermediate between the different polymer blocks of the triblock copolymer. In some embodiments, the coating may be applied by spin coating, spray coating, dipping coating, immersion coating, or otherwise depositing or applying a relatively thin coating of a material that has a chemical property (e.g., a hydrophilicity) that is approximately between corresponding chemical properties of the different polymer blocks. An example material of the coating is a copolymer that has alternating monomers of the different block copolymers. For example, for a triblock copolymer including blocks of polymer A and a block of polymer B, the coating may include a copolymer of A and B where the monomers A and B are highly mixed within the copolymer (e.g., A-B-A-B-A-B-AB-A-B, A-A-B-B-B-A-B-B-A-A-A, etc.). Additionally or alternatively, other types of surface treatments (e.g., oxidizing or de-oxidizing) may be used to modify the guiding pattern layer 310.

Figure 4:
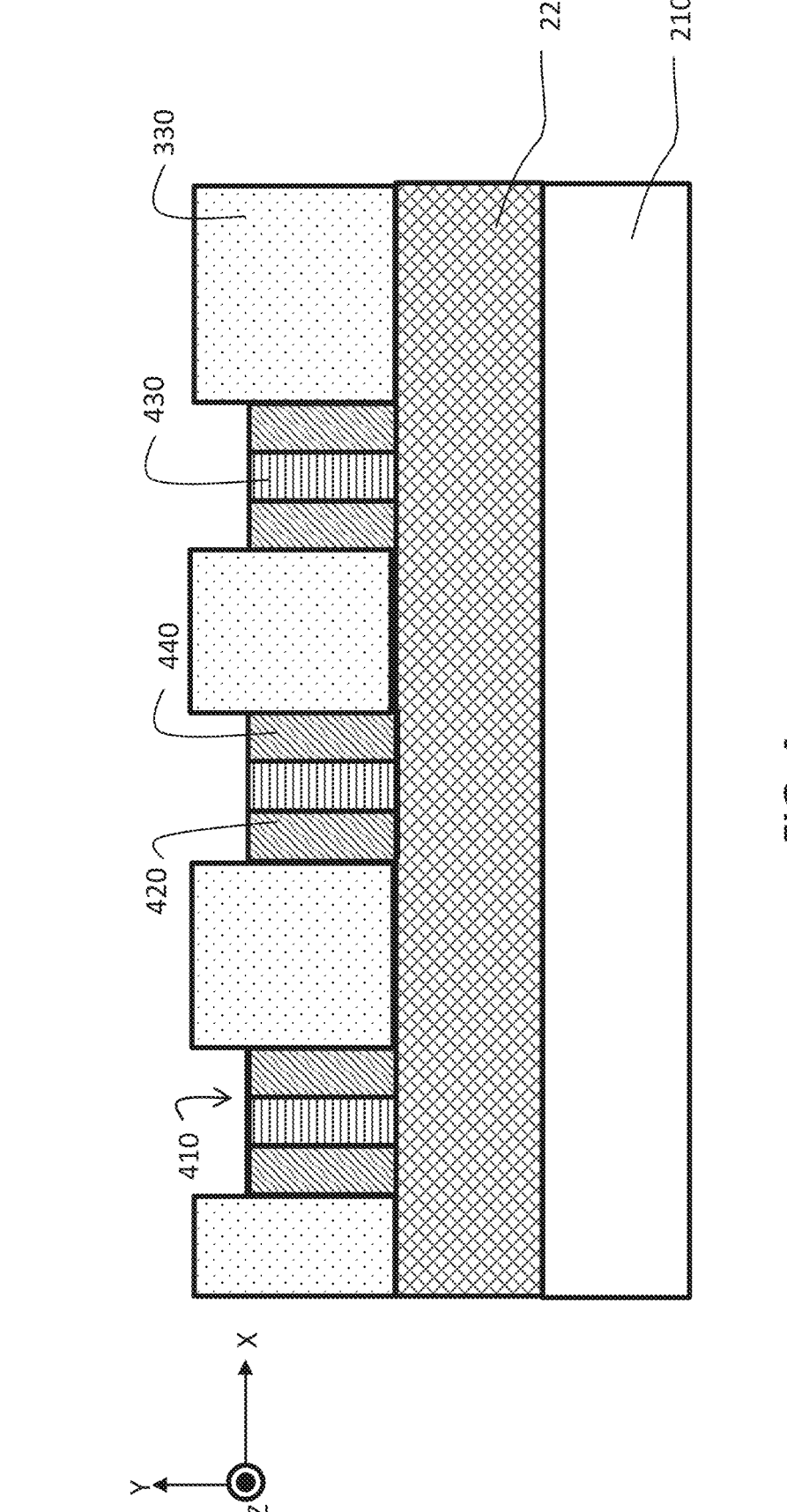

FIG. 4 shows an IC device 400 formed by filling the openings 320 of the IC device 300 with the lamellar triblock copolymer. In some embodiments, the openings 320 are filled with melts of the triblock copolymer. The triblock copolymer self-assembles, e.g., through microphase separation of the three blocks in the triblock copolymer, as directed by the guiding pattern and forms the lamellar triblock copolymer. In an embodiment, the self-assembly of the triblock copolymer occurs through rearrangement or repositioning of the different polymer blocks of the triblock copolymer molecules. The self-assembly of the triblock copolymer is directed by the topographical guiding pattern. In an embodiment, the self-assembly of the triblock copolymer may be drive by surface force, e.g., tension, applied by the guiding walls 330. During the self-assembly process, the lamellar structure 410 is aligned relative to the guiding walls 330, which achieves a better alignment compared with lithographical alignment and therefore, can be used to form very small via openings (e.g., nanoscale).

In some embodiments, an annealing treatment may be applied to the triblock copolymer in order to initiate, accelerate, or otherwise promote the self-assembly. In some embodiments, the annealing treatment may be a solvent annealing treatment that happens in an atmosphere of solvent vapor. The solvent vapor may be a vapor of acetone, tetrahydrofuran, or other types of organic solvent. The solvent annealing treatment can propose diffusion and self-assembly kinetics of larger polymers, such as triblock copolymers. In other embodiments, the annealing treatment may include a treatment that is operable to increase a temperature of the triblock copolymer. One example of such a treatment is heating the IC device 400 (e.g., in an oven or under a thermal lamp), applying infrared radiation to the triblock copolymer, or otherwise applying heat to or increasing the temperature of the triblock copolymer. The heating may help to provide energy to the molecules of the triblock copolymer molecules to make them more mobile/flexible in order to increase the rate of the microphase separation. The annealing is performed at a temperature that is high enough to increase the rate of microphase separation but low enough to avoid damaging the triblock copolymer or other components of the IC device 400. In some embodiments, the annealing temperature is in a range from 50° C. to 300° C.

As shown in FIG. 3, lamellar structures 410 (individually referred to as "lamellar structure 410") have filled the openings 320 and are present between the guiding walls 330. An embodiment of a lamellar structure 410 is the lamellar structure 130 in FIG. 1B. In the embodiment of FIG. 3, an individual opening 320 is filled with one triblock copolymer molecule, e.g., the triblock copolymer molecule 100 in FIG. 1A, that forms one lamellar structure 410. In other embodiments, an individual opening 320 may be filled with multiple triblock copolymer molecules that form multiple lamellar structures.

The lamellar structure 410 includes a first lamella 420, a second lamella 430, and a third lamella 440, which are formed from the three blocks of the triblock copolymer. The second lamella 430 is between the first and third lamellae 420 and 440 and has a different polymer from the first and third lamellae 420 and 440. An embodiment of the first lamella 420 is the polymer A lamella 140 in FIG. 1B. An embodiment of the second lamella 430 is the polymer B lamella 150 in FIG. 1B. An embodiment of the third lamella 440 is the polymer A lamella 160 in FIG. 1B. Other embodiments of the lamellar structure 410 may include different lamellae. For instance, the first lamella 420 may include a different polymer from the third lamella 440. The first, second, and third lamellae 420, 430, and 440 elongates along the Y axis as shown in FIG. 4, which is perpendicular to the intermediate layer 220. In FIG. 4, the length of the lamellar structure 410 along the Y axis is smaller than the length of the openings 320. In other embodiments, the length of the lamellar structure 410 may be the same as the length of the openings 320. The first, second, and third lamellae 420, 430, and 440 may have a same or different widths along the X or Z axis.

The self-assembly of the triblock copolymer molecule may cause the lamellar structure 410 to be substantially centered in the corresponding opening 320, e.g., in the X dimension and Z dimension. Dimensions (such as a width along the X axis or a length along the Z axis) of the first lamella 420, second lamella 430, or third lamella 440 may be based at least in part upon the length of the corresponding block of the triblock copolymer. In embodiments where the polymer blocks for the first and third lamellae 420 and 440 have same or similar lengths, the second lamella 430 can be located at the center, or close to the center, of the opening 320. In various embodiments, the first and third lamellae 420 and 440 are more rigid than the second lamella 430 and can define a space where the second lamella 430 is formed. In an embodiment where the space is big, the polymer block forming the second lamella 430 may stretch to fill up the space. In another embodiment where the space is small, the polymer block forming the second lamella 430 may be compressed to fit in the space. For example, the polymer block forming the second lamella 430 may fold onto itself to fit in the space. By using such a triblock copolymer, the dimensions of the second lamella 430 can be controlled by controlling the length of the polymer blocks forming the first and third lamellae 420.

Figures 5, 6:
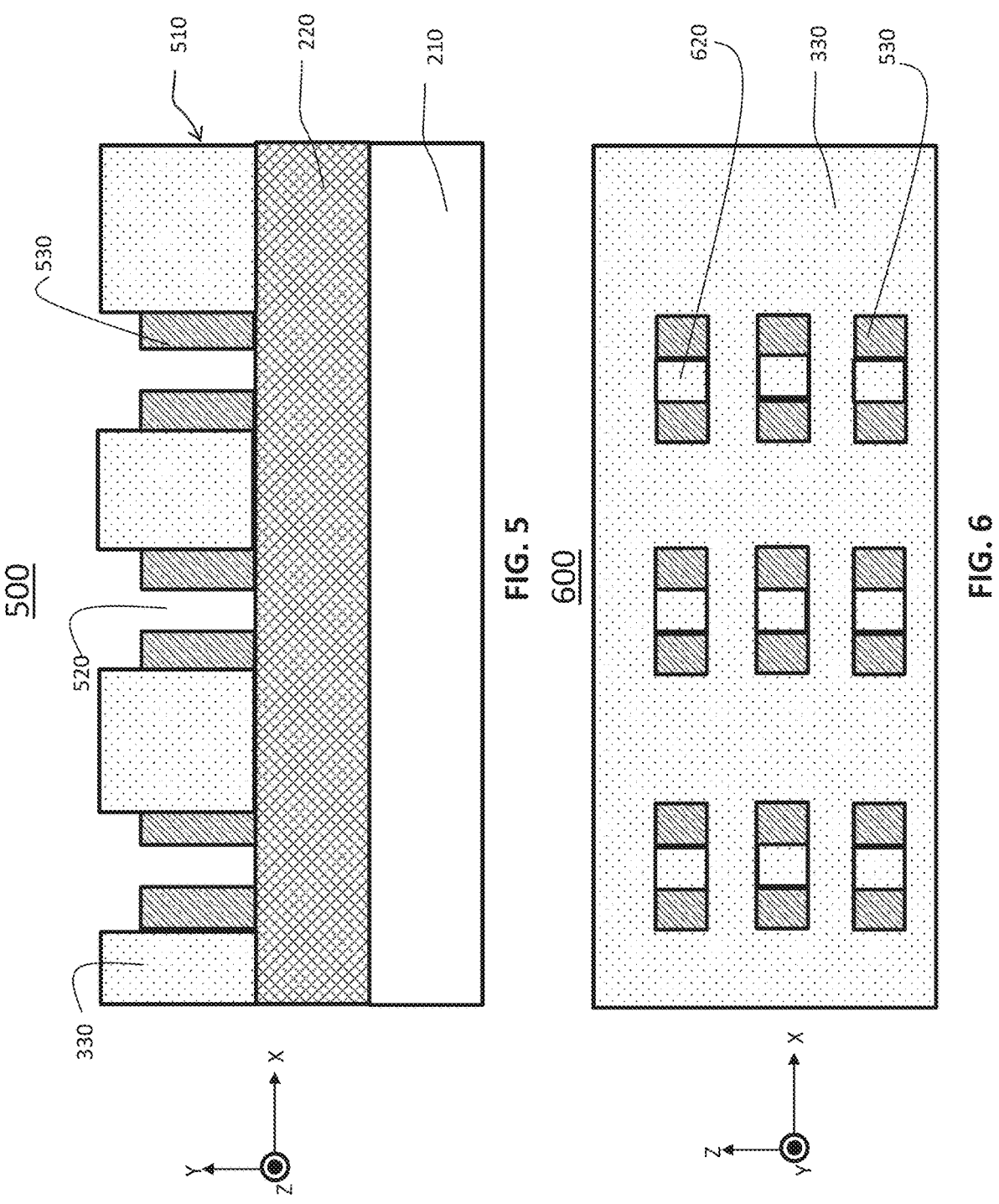

FIG. 5 shows an IC device 500 including a via opening layer 510, in which via openings 520 (individually referred to as "via opening 510") are formed. A via opening 520 is formed by removing the second lamella 430 from the corresponding lamellar structure 410. The via opening 520 is defined by one or more the via opening walls 530 (individually referred to as "via opening wall 530") and the guiding wall 330. The via opening walls 530 include the first and third lamellae 420 and 440 of the corresponding lamellar structure 410 and one or more portions of the guiding wall 330.

In some embodiments, the second lamella 430 is removed by performing an etching process (e.g., a selective etching process) on the lamellar structures 410. The second lamella 430 is etched at a higher rate than the first and third lamellae 420 and 440. The first and third lamellae 420 and 440 remain completely or substantially unetched after the etching process. In an embodiment, the etching process includes an isotropic chemically selective etch. In another embodiment, the etching process includes placing a hard mask on top of the lamellar structure 410. The hard mask includes a hole corresponding to the second lamella 430 so that the second lamella 430 is exposed to the etching but the first and third lamellae 420 and 440 are not exposed. The higher rigidity of the first and third lamellae 420 and 440 also helps to eliminate or reduce etching of the first and third lamellae 420 and 440.

In some embodiments, the ratio of the length of the lamellar structures 410 along the Y axis to the length of the via openings 430 along the Y axis is in a range from 0.3 to 2.0. In an embodiment, the ratio of the length of the lamellar structures 410 to the length of the via openings 430 is in a range from 0.3 to 1.5. The embodiment of FIG. 5 removes the second lamella 430 from all the lamellar structures 410. In other embodiments, the second lamella 430 is removed from a subset of the lamellar structures 410. FIG. 5 shows removal of the whole second lamella 430. In other embodiments, a via opening 520 may be formed by removing a portion of the second lamella 430. As shown in FIG. 6, the via openings 520 have rectangular cross-sections. In other embodiments, the cross-sections of the via openings 520 can have other shapes, e.g., square, a curved shape, etc.

FIG. 6 shows a top view of an IC device 600 including vias 620. In some embodiments, a via opening 520 is partially or completed filled with an electrically conductive material, such as a metal or an alloy, to form the corresponding via 620. A via 620 can be a through via, blind via, or buried via. the ratio of the length of the lamellar structures 410 along the Y axis to the length of the via 620 along the Y axis may be in a range from 0.3 to 2.0.

Figures 7A, 7B:
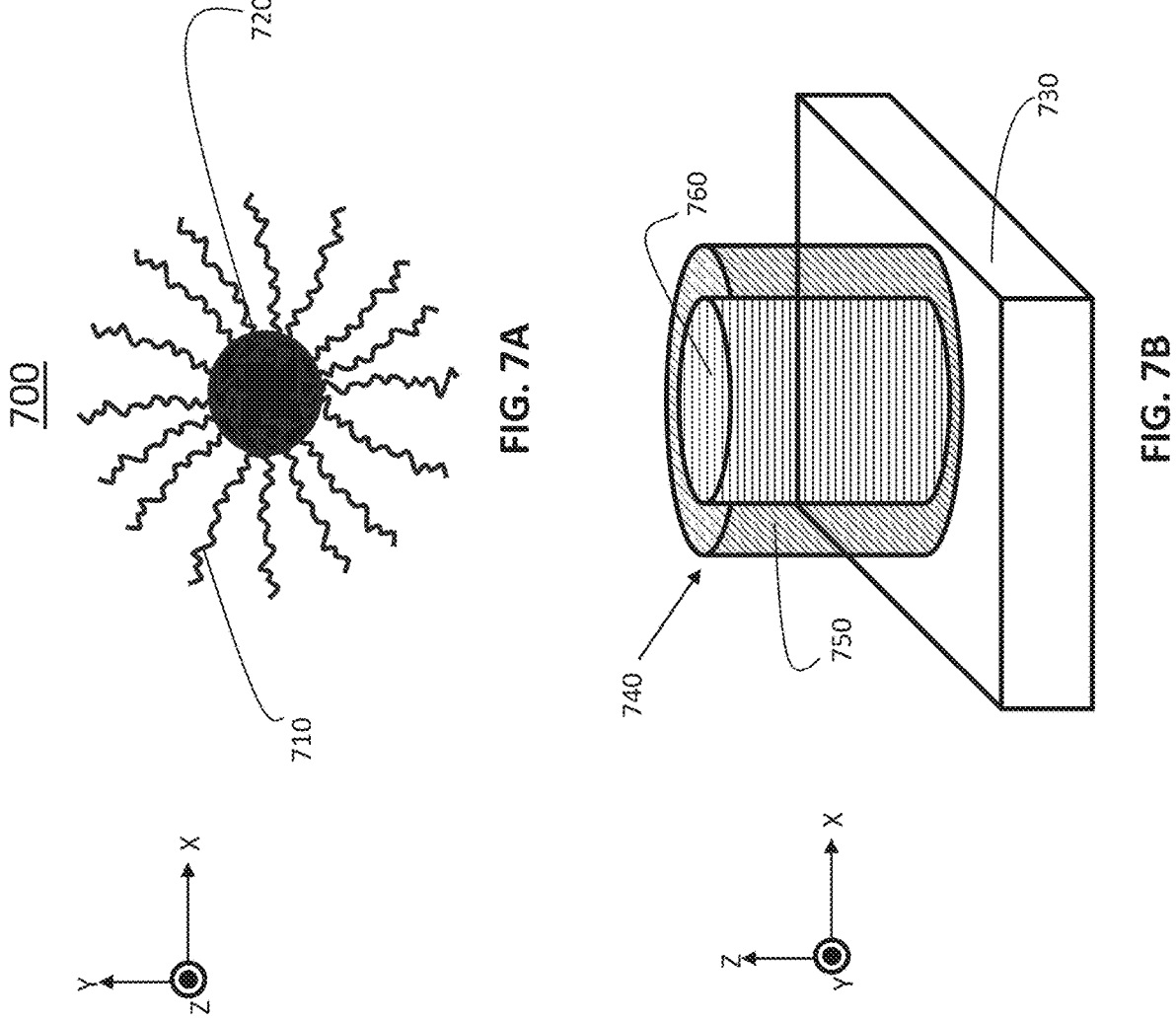
FIGS. 7A-7B illustrate a polymer nanocomposite, in accordance with some embodiments.

FIGS. 7A-7B illustrate a polymer nanocomposite, in accordance with some embodiments. FIG. 7A shows a molecule 700 of the polymer nanocomposite ("polymer nanocomposite molecule 700"). The polymer nanocomposite molecule 700 includes a polymer 710 surrounding a nanoparticle 720 in the X and Y dimensions. One or more chains of the polymer 710 are attached on the nanoparticle 720. The polymer 710 may be polyethylene, polystyrene, polyvinylchloride, polytetrafluorethylene, polydimethylsiloxane, some polyesters, some polyurethanes, acrylics, epoxies, P(t-Butyl Acrylate), polyacrylic acid, polyacrylamide, maleic anhydride polymers, polyethylene, polypropylene, polyacrylonitrile, polybutadiene, polyvinyl acetate, polyacetic acid, polybutyl acrylate, polylactic acid, polycaprolactone, poly(ethylene glycol), polyisoprene, and so on. The nanoparticle 720 has a nanoscale size. For example, the size of the nanoparticle 720 in the X, Y, or Z dimension is in a range from 1 to 100 nanometers. The nanoparticle 720 may be made from an inorganic material. Example materials of the nanoparticle 720 include $SiO_2$, Ag, Au, CdSe, $Fe_3O_4$, graphene, TiOx, SnOx, ZrOx, silsesquioxanes, and so on.

FIG. 7B shows a cylindrical structure 740 formed by the polymer nanocomposite molecule 700 on a surface of a layer 730. In other embodiments, the cylindrical structure 740 may be formed by multiple polymer nanocomposite molecules 700. The cylindrical structure 740 elongates along the Y axis, which is perpendicular to the surface of the layer 730. The cylindrical structure 740 includes a polymer cylinder 750 formed from the polymer 710 and a nanoparticle cylinder 760 formed from the nanoparticle 720. The polymer cylinder 750 is hollow and encloses the nanoparticle cylinder 760 in the X dimension and Y dimension. Accordingly, the inner diameter of the polymer cylinder 750 is the same as the diameter of the nanoparticle cylinder 760, and the outer diameter of the polymer cylinder 750 is larger than the diameter of the nanoparticle cylinder 760. A length of the polymer cylinder 750 along the Z axis is the same as the length of the nanoparticle cylinder 760 along the Z axis. In other embodiments, the length of the polymer cylinder 750 may be shorter or longer than the length of the nanoparticle cylinder 760.

The layer 170 may be a semiconductor substrate. In some embodiments, the layer 730 includes a grating pattern, e.g., an alternative pattern of first sections and second sections. The first sections include a different material from the second section. The cylindrical structure 740 may be formed in accordance with the grating pattern.

Figures 8, 9:
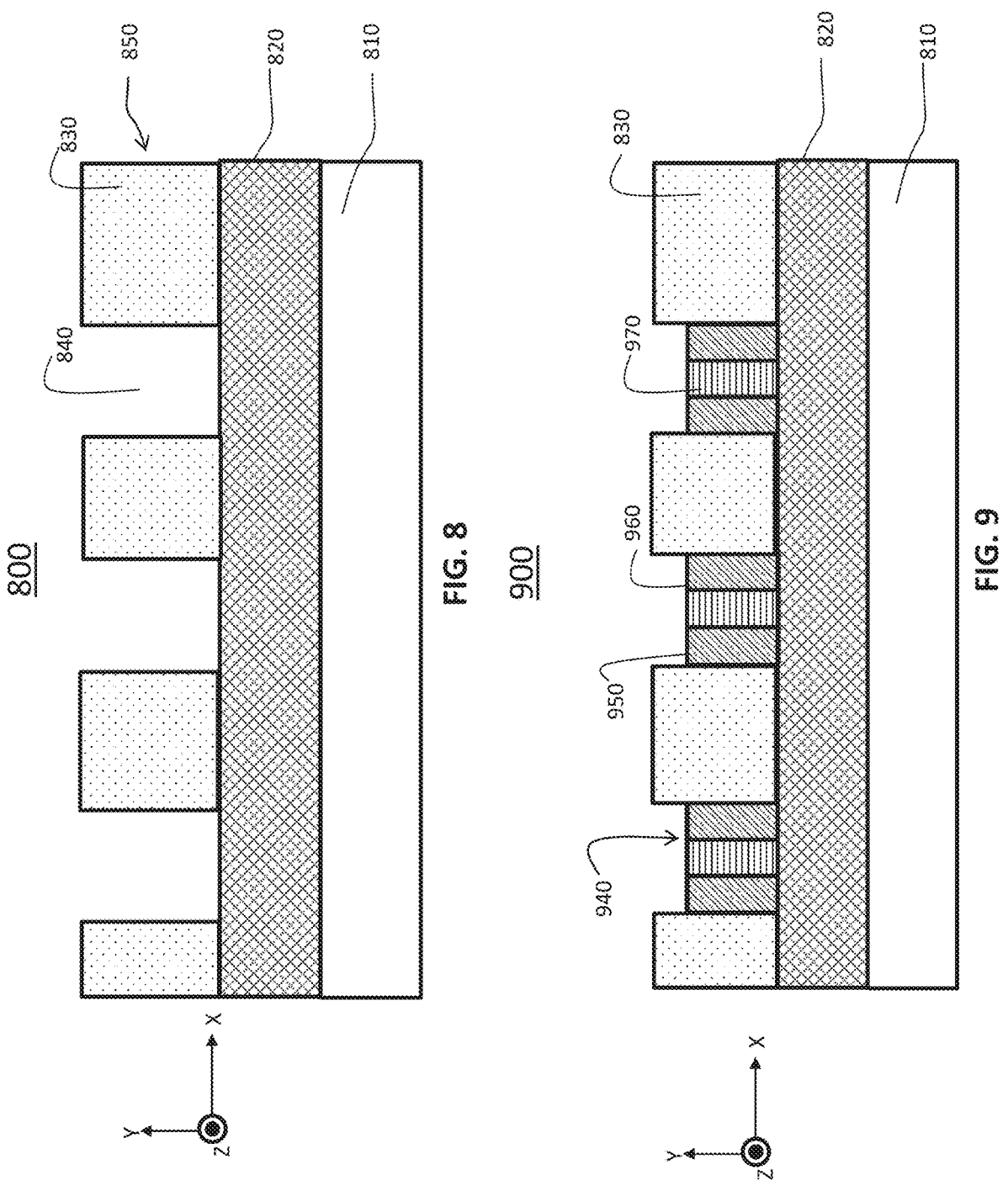
FIGS. 8-11 illustrate a process of forming via openings by using the polymer nanocomposite, in accordance with some embodiments.

FIGS. 8-11 illustrate a process of forming via openings 1020 by using the polymer nanocomposite, in accordance with some embodiments. FIG. 8 shows an IC device 800. The IC device 800 includes a substrate 810, an intermediate layer 820 over (e.g., attached on) the substrate 810, and a guiding pattern layer 850 over the intermediate layer 820. In other embodiments, the IC device 800 may include different components. For instance, the IC device 800 may not include the intermediate layer 820 and the guiding pattern layer 850 is formed on the substrate 810.

The substrate 810 may include a semiconductor material. Examples of the semiconductor material include, for example, single crystal silicon, polycrystalline silicon, SOI, other suitable semiconductor material, or some combination thereof. The substrate 810 may also include other materials, such as metal, dielectric, dopant, and so on. In some embodiments, the substrate 810 may include various IC components, such as transistors, etc. In some embodiments, the substrate 810 is a general workpiece object used to manufacture integrated circuits.

The intermediate layer 820 includes a dielectric or insulating material. Examples of the dielectric material include, for example, oxides of silicon (e.g., silicon dioxide (SiO)), doped oxides of silicon, fluorinated oxides of silicon, carbon doped oxides of silicon, various low-k dielectric materials known in the arts, and combinations thereof. The dielectric layer may be formed by conventional techniques, such as, for example, CVD, plasma enhanced CVD, PVD, ALD (atomic layer deposition), plasma enhanced ALD, spinning on, annealing, or by other deposition methods. In an embodiment, the intermediate layer 820 includes a grating pattern that guides self-assembly of the lamellar triblock copolymer.

The guiding pattern layer 850 includes a topographical guiding pattern. In FIG. 8, the topographical guiding pattern is an alternative pattern of guiding walls 830 (individually referred to as "guiding wall 830") and openings 840 (individually referred to as "opening 840"). Each opening 840 is between two guiding walls 830 that defines the opening 840. In some embodiments, the guiding pattern layer 850 is formed by using EUV, immersion lithography (e.g., by using UV light at 193 nm wavelength), deep UV lithography (e.g., dry 193 nm photolithography), other types of lithography techniques. The topographical guiding pattern is three-dimensional.

FIG. 9 shows an IC device 900 formed by filling the openings 840 of the IC device 800 with cylindrical structures 940 (individually referred to as "cylindrical structure 940"). An embodiment of the cylindrical structure 940 is the cylindrical structure 740 in FIG. 7B As shown in FIG. 9, the cylindrical structure 940 is present between the guiding walls 830. The cylindrical structures 940 are formed by applying a polymer nanocomposite on the guiding pattern layer 850, e.g., into the openings 840 of the guiding pattern layer 850

A cylindrical structure 940 is formed from a polymer nanocomposite molecule, e.g., the polymer nanocomposite molecule 700 in FIG. 7A. The cylindrical structure 940 includes a polymer cylinder 950 and a nanoparticle cylinder 960. The polymer cylinder 950 is hollow and at least partially encloses the nanoparticle cylinder 960 in the X dimension and Z dimension. In an embodiment, the polymer cylinder 950 is formed by the polymer 710 in FIG. 7A and the nanoparticle cylinder 960 is formed by the nanoparticle 720. The cylindrical structure 940 elongates along the Y axis as shown in FIG. 9, which is perpendicular to the intermediate layer 820. In FIG. 9, the length of the cylindrical structure 940 along the Y axis is smaller than the length of the openings 840. In other embodiments, the length of the cylindrical structure 940 may be the same as the length of the openings 840. The polymer cylinder 950 may expand or contract to occupy the space inside the via opening as efficiently as possible.

The topographical guiding pattern in the guiding pattern layer 850 directs the polymer nanocomposite molecules to form the cylindrical structures 940. In some embodiments, the topographical guiding pattern directs formation of the cylindrical structures 940 through mechanisms such as commensurability, lateral ordering, confinement effects, etc. The formation of the cylindrical structures 940 may be drive by surface force, e.g., tension, applied by the guiding walls 330. During the formation process, the cylindrical structures 940 are aligned relative to the guiding walls 830, which achieves a better alignment compared with lithographical alignment and therefore, can be used to form very small via openings (e.g., nanoscale). Also, as the nanoparticle is surrounded by the polymer (e.g., as shown in FIG. 7A), the nanoparticle cylinder 960 can be centered or substantially centered in the corresponding opening 840, e.g., in the X dimension and Z dimension. The dimensions (e.g., outer diameter or length) of the polymer cylinder 950 may be based at least in part upon the relative length of the chain of the polymer forming the polymer cylinder 950. The dimensions (e.g., diameter or length) of the nanoparticle cylinder 960 may be based at least in part upon the dimensions of the nanoparticle forming the nanoparticle cylinder 960. The polymer in the polymer nanocomposite molecule may be designed so that diameters of the polymer cylinder 950 and the nanoparticle cylinder 960 as well as the pitch of the polymer cylinder 950 and the nanoparticle cylinder 960 (center-to-center spacing between closest adjacent cylindrical structures 940) is appropriate for the predetermined pitch.

In some embodiments, an annealing treatment may be applied to the cylindrical structure 940 in order to initiate, accelerate, or otherwise promote the formation of the polymer cylinders 950 or nanoparticle cylinders 960. In some embodiments, the annealing treatment may be a solvent annealing treatment that happens in an atmosphere of solvent vapor. The solvent vapor may be a vapor of acetone, tetrahydrofuran, or other types of organic solvent. The solvent annealing treatment can propose diffusion and self-assembly kinetics of larger polymers, such as triblock copolymers. In other embodiments, the annealing treatment may include a treatment that is operable to increase a temperature of the cylindrical structure 940. One example of such a treatment is heating the IC device 900 (e.g., in an oven or under a thermal lamp), applying infrared radiation to the cylindrical structure 940, or otherwise applying heat to or increasing the temperature of the cylindrical structure 940. The annealing is performed at a temperature that is high enough to increase the rate of self-assembly but low enough to avoid damaging the cylindrical structure 940 or other components of the IC device 900.

In some embodiments, the guiding pattern layer 850 may be physically tailored or chemically modified to impose different affinity to the polymer and nanoparticle in the polymer nanocomposite to enforce the orientation of the polymer cylinders 950 and nanoparticle cylinders 960, which is perpendicular to the intermediate layer 820. In other embodiments, a surface treatment may be performed to modify the guiding pattern layer 850. The surface treatment may make portions of the guiding pattern layer 850 (e.g., surfaces of the openings 320) chemically neutral, or at least relatively more neutral, to the polymer and nanoparticle. A non-neutral surface may have a greater interaction tendency (e.g., repulsive or attractive) with the polymer than the nanocomposite, then the non-neutral surface would tend to influence the formation of the cylindrical structure 940 in a way that may not be desired. In some embodiments, the surface treatment may be an application of a coating having a chemical property (e.g., a hydrophilic/hydrophobic property) that is intermediate between the polymer and nanocomposite. In some embodiments, the coating may be applied by spin coating, spray coating, dipping coating, immersion coating, or otherwise depositing or applying a relatively thin coating of a material that has a chemical property (e.g., a hydrophilicity) that is approximately between corresponding chemical properties of the polymer and nanocomposite. Additionally or alternatively, other types of surface treatments (e.g., oxidizing or de-oxidizing) may be used to modify the guiding pattern layer 850.

Figures 10, 11:
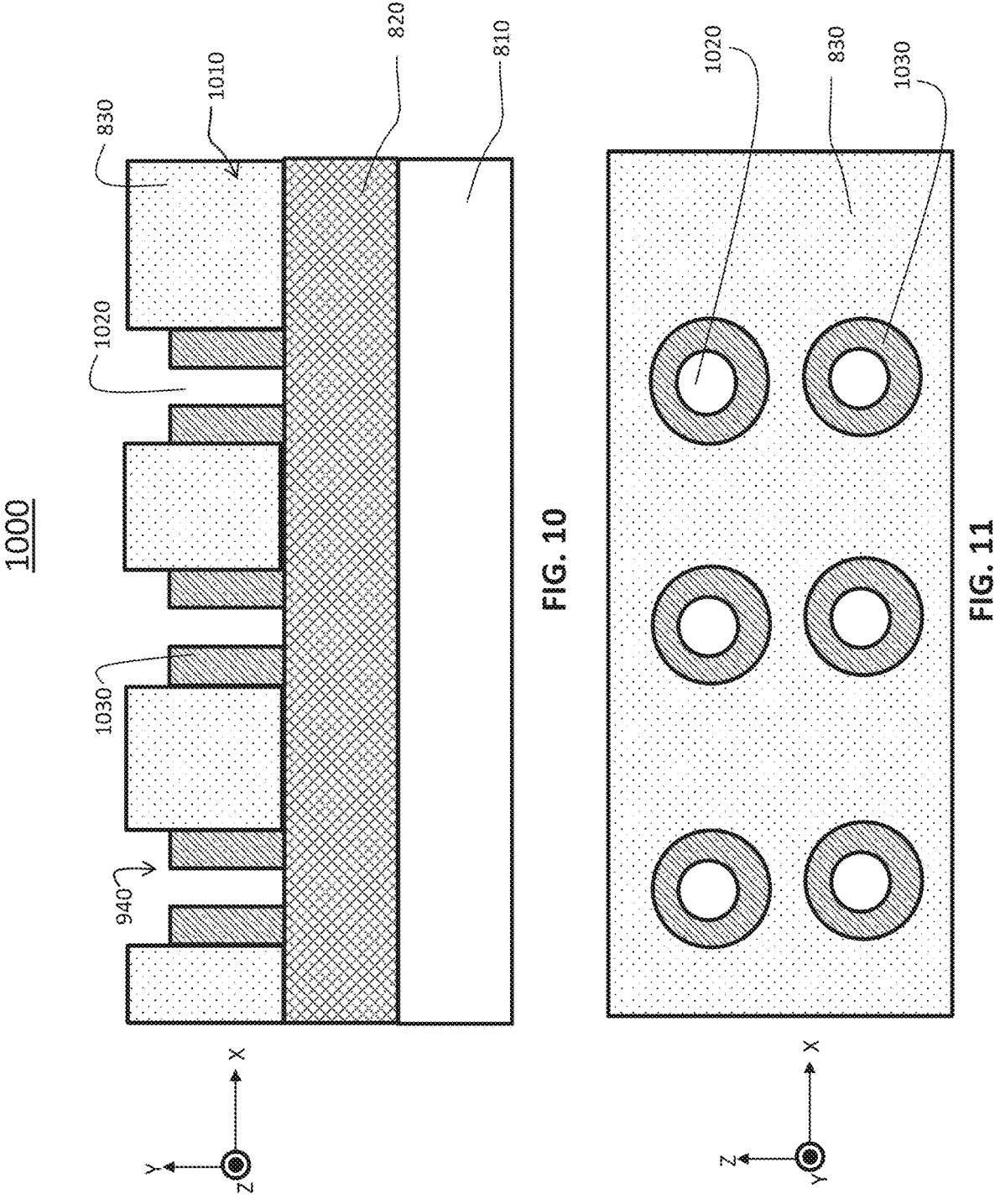

FIG. 10 shows an IC device 1000 including a via opening layer 1010, in which via openings 1020 (individually referred to as "via opening 1020") are formed. FIG. 11 shows a top view of the IC device 1000. A via opening 1020 is formed by removing the nanoparticle cylinder 960 from the cylindrical structure 940. The via opening 1020 is defined by the corresponding via opening wall 1030. The via opening wall 1030 is the polymer cylinder 950. The embodiment of FIG. 10 removes the nanoparticle cylinder 960 from all the cylindrical structures 940. In other embodiments, the nanoparticle cylinder 960 is removed from a subset of the cylindrical structures 940. FIG. 10 shows removal of the whole nanoparticle cylinder 960. In other embodiments, a via opening 1020 may be formed by removing a portion of the nanoparticle cylinder 960. In some embodiments, the ratio of the length of the cylindrical structures 940 along the Y axis to the length of the via openings 1020 along the Y axis is in a range from 0.3 to 2.0. In some embodiments, some or all of the via openings 1020 may be partially or completely filled with an electrically conductive material to form vias.

In some embodiments, the nanoparticle cylinder 960 is removed by performing an etching process (e.g., a selective etching process) on the cylindrical structures 940. The nanoparticle cylinder 960 is etched at a higher rate than the polymer cylinder 950. The polymer cylinder 950 may remain substantially unetched after the etching process. In an embodiment, the etching process includes an isotropic chemically selective etch. As shown in FIG. 11, the via openings 1020 have circular cross-sections. In other embodiments, the cross-sections of the via openings 1020 can have other shapes, e.g., square, rectangular, etc.

FIGS. 12-15 illustrates a process of forming via openings 1520 by using chemoepitaxy, in accordance with some embodiments. The via opening formation may use a triblock copolymer (e.g., the triblock copolymer described above in conjunction with FIGS. 1A-1B) or a polymer nanocomposite (e.g., the polymer nanocomposite described above in conjunction with FIGS. 7A-7B).

Figures 12, 13:
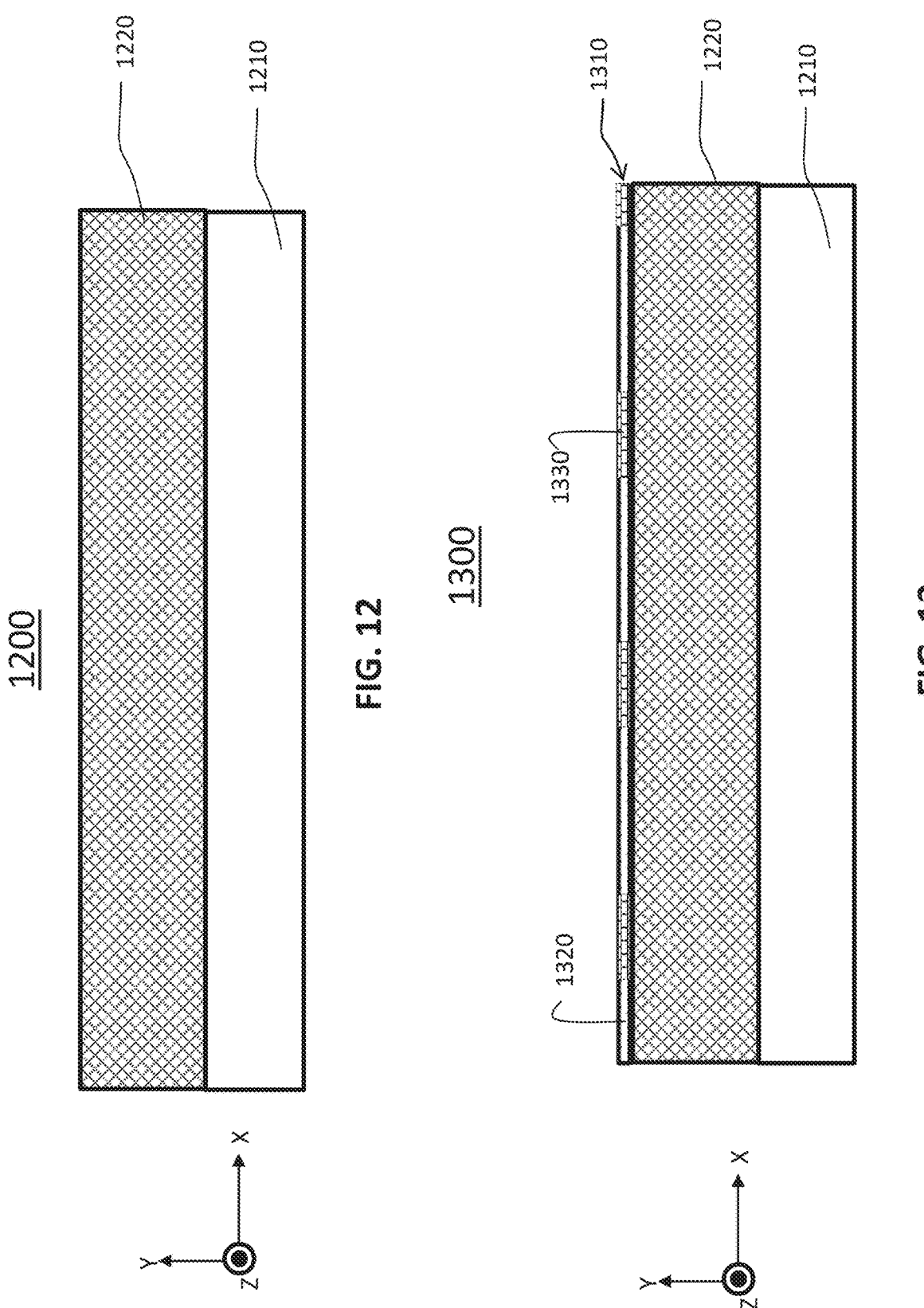
FIGS. 12-15 illustrates a process of forming via openings by using chemoepitaxy, in accordance with some embodiments.

FIG. 12 shows an IC device 1200 that includes an intermediate layer 1220 over a substrate 1210. The substrate 1210 may include a semiconductor material. Examples of the semiconductor material include, for example, single crystal silicon, polycrystalline silicon, SOI, other suitable semiconductor material, or some combination thereof. The substrate 1210 may also include other materials, such as metal, dielectric, dopant, and so on. In some embodiments, the substrate 1210 may include various IC components, such as transistors, etc. In some embodiments, the substrate 1210 is a general workpiece object used to manufacture integrated circuits.

The intermediate layer 1220 includes a dielectric or insulating material. Examples of the dielectric material include, for example, oxides of silicon (e.g., silicon dioxide (SiO)), doped oxides of silicon, fluorinated oxides of silicon, carbon doped oxides of silicon, various low-k dielectric materials known in the arts, and combinations thereof. The dielectric layer may be formed by conventional techniques, such as, for example, CVD, PVD, or by other deposition methods. In an embodiment, the intermediate layer 220 includes a grating pattern that guides self-assembly of the lamellar triblock copolymer.

FIG. 13 shows an IC device 1300. The IC device 1300 is formed by generating a guiding pattern layer 1310 on the IC device 1200, e.g., on a surface of the intermediate layer 1220. The guiding pattern layer 1310 includes a chemical guiding pattern. In FIG. 13, the chemical guiding pattern is an alternative pattern of first sections 1320 (individually referred to as "first section 1320") and second sections 1330 (individually referred to as "second section 1330"). Each second section 1330 is between two first sections 1320 that defines the second section 1330. The first sections 1320 have different chemical properties from the second sections 1330. In embodiments where a triblock copolymer is used, the first section 1320 or second section 1330 has different chemical affinity to different polymer blocks of the triblock copolymer to enforce the orientation of the lamellar triblock copolymer, which is perpendicular to the intermediate layer 1220. In embodiments where the polymer nanocomposite is used, the first section 1320 or second section 1330 has different chemical affinity to the polymer and the nanocomposite in the polymer nanocomposite. Accordingly, the chemical guiding pattern can guide self-assembly of the triblock copolymer and the polymer nanocomposite. In an embodiment, the first sections 1320 include a different material from the second sections 1330.

Figures 14, 15:
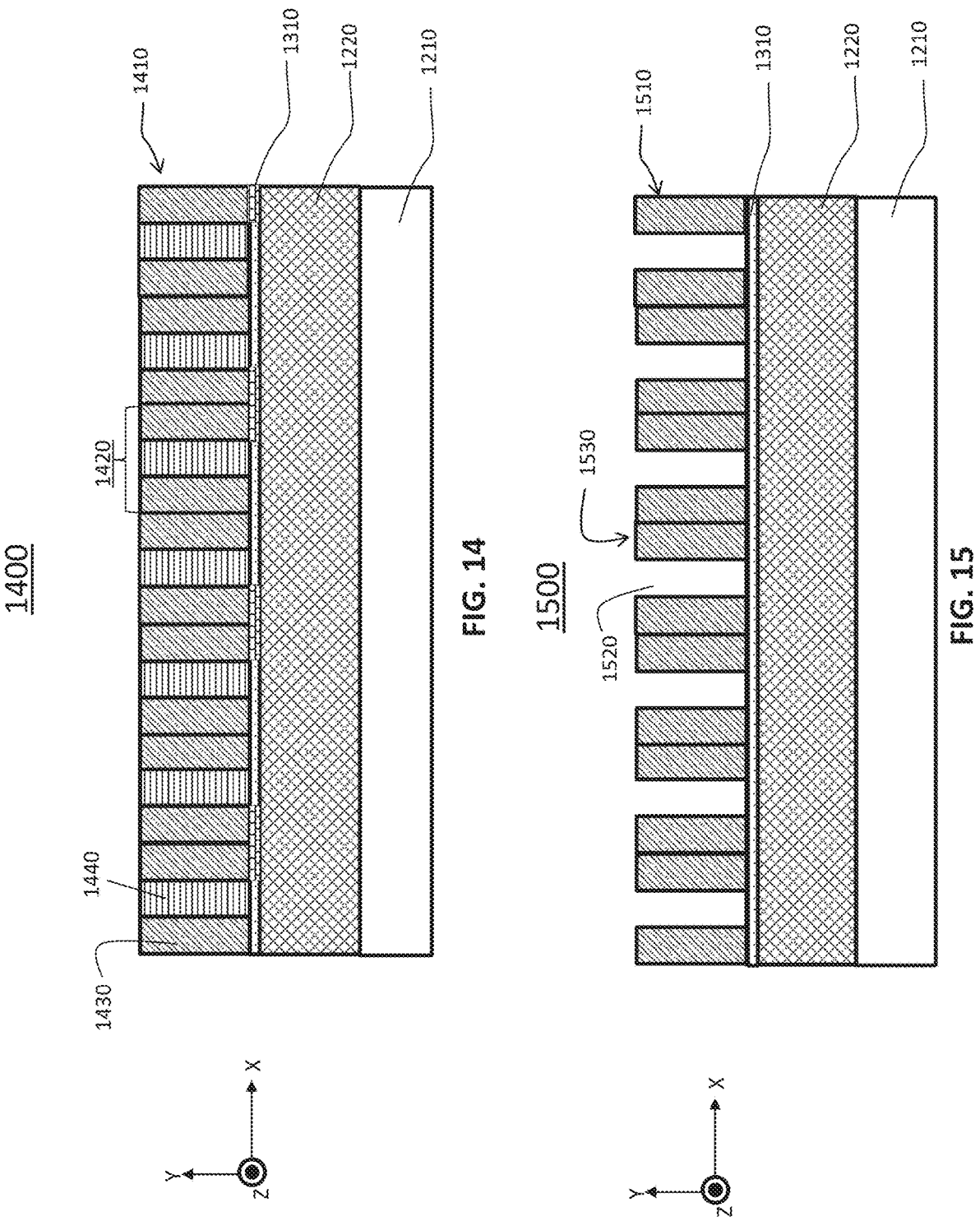

FIG. 14 shows an IC device 1400 generated by forming a repetitive structure layer 1410 over the guiding pattern layer 1310. The repetitive structure layer 1410 includes a plurality of structures 1420 (individually referred to as "structure 1420"). A structure 1420 includes a first element 1430 and second element 1440, with the second material being at least partially enclosed by the first element 1430. The structures 1420 may be formed by applying a triblock copolymer or a polymer nanocomposite on the guiding pattern layer 1310.

In some embodiments, the repetitive structure layer 1410 is formed by using the triblock copolymer. A structure 1420 is a lamellar structure, e.g., the lamellar structure 130 in FIG. 1B. The first element 1430 includes two lamellae of the lamellar structure, e.g., the polymer A lamellae 140 and 160 in FIG. 1B. The second element 1440 may be the polymer B lamella 150 in FIG. 1B. In an embodiment, the triblock copolymer is deposited on the guiding pattern layer 1310. The chemical guiding pattern of the guiding pattern layer 1310 guides microphase separation of the triblock copolymer. In an embodiment, the second section 1330 (or the first section 1320) of the guiding pattern layer 1310 has a differentiated chemical affinity to different polymers in the triblock copolymer. For example, the second section 1330 has a stronger chemical affinity to polymer A than polymer B. Accordingly, lamellae of polymer A will be formed over the second sections 1330 at a rate faster than lamellae of polymer B. Accordingly, the triblock copolymer self-assembles and forms lamellar structures based on the chemical guiding pattern. The self-assembly of the triblock copolymer is drive by the differentiated chemical affinity of the second sections 1330. During the self-assembly process, the lamellar structures are aligned relative to the second sections 1330, which achieves a better alignment compared with lithographical alignment and therefore, can be used to form very small via openings (e.g., nanoscale). In some embodiments, an annealing treatment may be applied to the triblock copolymer in order to initiate, accelerate, or otherwise promote the self-assembly. The annealing treatment may include a treatment that is operable to increase a temperature of the triblock copolymer. The annealing is performed at a temperature that is high enough to increase the rate of microphase separation but low enough to avoid damaging the triblock copolymer or other components of the IC device 1400.

In other embodiments, the repetitive structure layer 1410 may be formed by using the polymer nanocomposite. A structure 1420 is a cylindrical structure, e.g., the cylindrical structure 740 in FIG. 7B. The first element 1430 may be the polymer cylinder 750 and the second element 1440 may be the nanoparticle cylinder 760 in FIG. 7B. The chemical guiding pattern of the guiding pattern layer 1310 guides the formation of the cylindrical structures. In an embodiment, the second section 1330 (or the first section 1320) of the guiding pattern layer 1310 has a differentiated chemical affinity to the polymer and nanoparticle in the polymer nanocomposite. For example, the second section 1330 has a stronger chemical affinity to the polymer than the nanoparticle. Accordingly, polymer cylinders will be formed over the second sections 1330 at a rate faster than nanoparticle cylinders. The cylindrical structures are aligned relative to the second sections 1330, which achieves a better alignment compared with lithographical alignment and therefore, can be used to form very small via openings (e.g., nanoscale). In some embodiments, an annealing treatment may be applied to the polymer nanocomposite in order to initiate, accelerate, or otherwise promote the formation of the cylindrical structures. The annealing treatment may include a treatment that is operable to increase a temperature of the polymer nanocomposite.

FIG. 15 shows an IC device 1500 including a via opening layer 1510, in which via openings 1520 (individually referred to as "via opening 1520") are formed. A via opening 1520 is formed by removing the second element 1440 from a structure 1420. The via openings 1520 are defined by the corresponding via opening wall 1530. The via opening wall 1530 includes the first element 1430 of the structure 1420. The embodiment of FIG. 15 removes the second element 1440 from all the structures 1420. In other embodiments, the second element 1440 is removed from a subset of the structures 1420. FIG. 15 shows removal of the whole second element 1440. In other embodiments, a via opening 1520 may be formed by removing a portion of the second element 1440. In some embodiments, the ratio of the length of the structures 1420 along the Y axis to the length of the via openings 1520 along the Y axis is in a range from 0.3 to 2.0. In some embodiments, some or all of the via openings 1520 may be partially or completely filled with an electrically conductive material to form vias.

In some embodiments, the second element 1440 is removed by performing an etching process (e.g., a selective etching process) on the repetitive structure layer 1410. The second element 1440 is etched at a higher rate than the first element 1430. The first element 1430 may remain substantially unetched after the etching process. In an embodiment, the etching process includes an isotropic chemically selective etch.

Figures 16, 17, 18, 19:
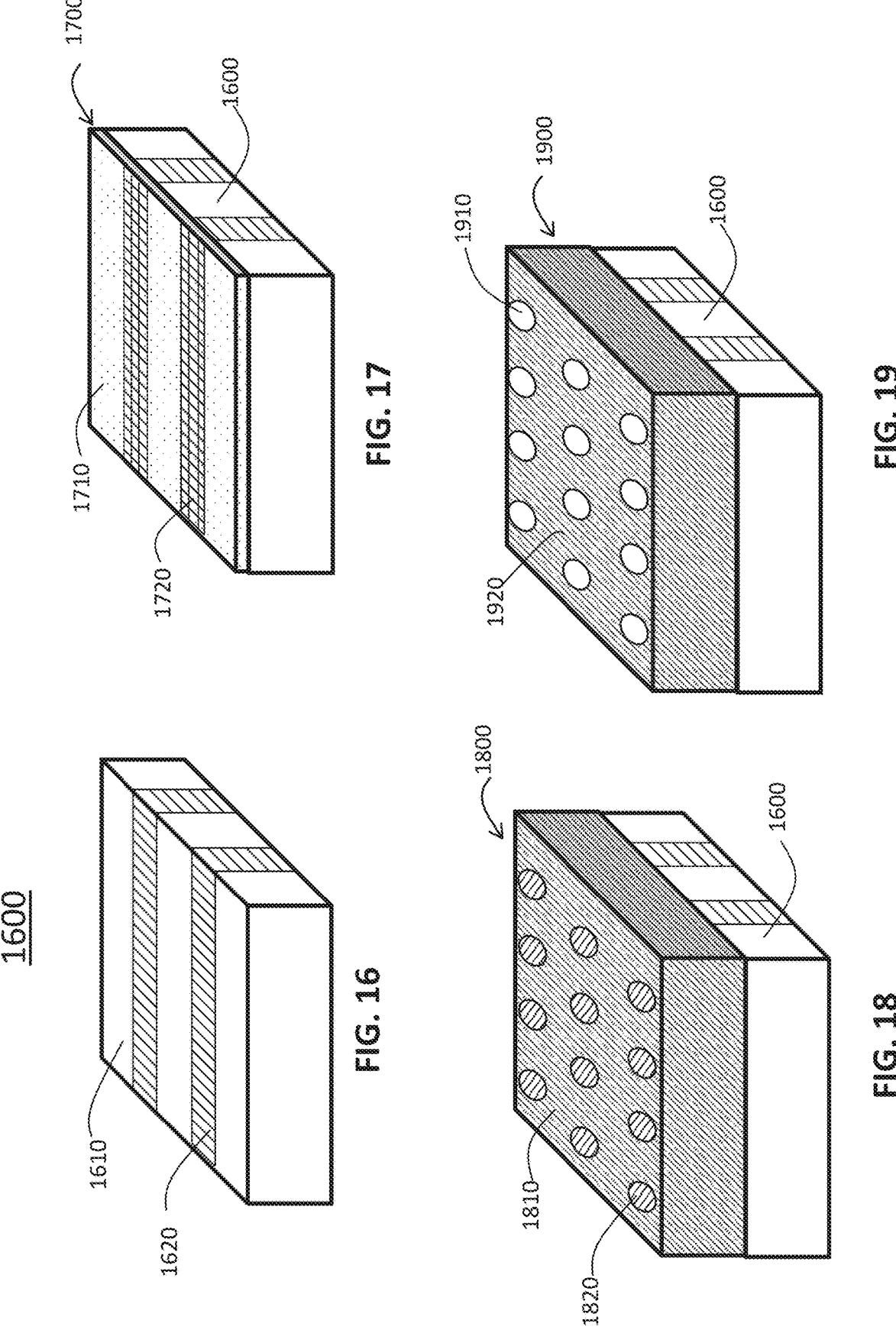
FIGS. 16-20 illustrates a process of forming via openings based on a grating pattern of a grating layer, in accordance with some embodiments.

FIGS. 16-20 illustrates a process of forming via openings 1910 based on a grating pattern of a grating layer 1600, in accordance with some embodiments. FIG. 16 is a perspective view of the grating layer 1600. The grating layer 1600 includes first grating sections 1610 (individually referred to as "first grating section 1610") and second grating sections 1620 (individually referred to as "second grating section 1620"). The first grating sections 1610 and second grating sections 1620 form a grating pattern, which is an alternative pattern. For instance, each second grating section 1620 is between two first grating sections 1610. The grating pattern limits where the via openings 1910 are formed. In the embodiment of FIGS. 16-20, the via openings 1910 are formed over the first grating sections 1610 and no via openings 1910 are formed over the second grating sections 1620. The grating layer 1600 may be an embodiment of the intermediate layer 220, 820, or 1220.

The first grating sections 1610 include a different material from the second grating sections 1620. In an embodiment, the first grating sections 1610 include a dielectric material and the second grating sections 1620 include a non-dielectric material, such as a metal or alloy. Examples of the dielectric material include silicon oxides, doped silicon oxides, fluorinated silicon oxides, carbon doped oxides, and so on. The second grating sections 1620 are metallic sections that include a metal or metal compound, such as Cobalt (Co), aluminum (Al), copper (Cu), Al-doped Cu, Ruthenium (Ru), Molybdenum (Mo), Titanium (Ti), Titanium nitride (TiN), Aluminum oxide (AlO$_x$), Hafnium oxide (HfO$_x$), Zirconium oxide (ZrO$_x$), Titanium oxide (TiO$_x$), Tungsten (W), and so on. In another embodiment, the first grating sections 1610 include a dielectric material (e.g., the examples listed above) and the second grating sections 1620 include a different dielectric material, such as metal oxide (e.g., alumina, etc.), carbon nitride, carbide, and so on. In yet another embodiment, the first grating sections 1610 include a resist material and the second grating sections 1620 include a non-resist material. In yet another embodiment, the first grating sections 1610 include a positive photoresist material and the second grating sections 1620 include a negative photoresist material.

FIG. 17 shows forming a guiding pattern layer 1700 over the grating layer 1600. The guiding pattern layer 1700 has a guiding pattern formed based on the grating pattern of the grating layer 1600. The guiding pattern layer 1700 may be formed by changing a part of the grating layer 1600. Alternatively, the guiding pattern layer 1700 is a coating formed on top of the grating layer 1600. The guiding pattern is an alternative pattern of a first material 1710 and second material 1720. As shown in FIG. 17, the first material 1710 is over the first grating sections 1610 and the second material 1720 is over the second grating sections 1620. The guiding pattern layer 1700 may be the chemical guiding pattern described above in conjunction with FIGS. 12-15.

In some embodiments, the guiding pattern layer 1700 is formed through a surface treatment of the grating layer 1600, e.g., by optionally applying a surface treatment to the first grating sections 1610 or second grating sections 1620 of the grating layer 1600. In an embodiment, polymers may be grated to the grating layer 1600, e.g., by using end groups. Examples of the end groups include polyethylene, polystyrene, polyvinylchloride, polytetrafluorethylene, polydimethylsiloxane, some polyesters, some polyurethanes, acrylics, epoxies, P(t-Butyl Acrylate), polyacrylic acid, polyacrylamide, maleic anhydride polymers, polyethylene, polypropylene, polyacrylonitrile, polybutadiene, polyvinyl acetate, polyacetic acid, polybutyl acrylate, polylactic acid, polycaprolactone, poly(ethylene glycol), polyisoprene, and so on. Polymers may be grafted selectively to the first grating sections 1610 or second grating sections 1620.

In some embodiments, a mask may be placed on the grating layer 1600 to cover the second grating sections 1620 but expose the first grating sections 1610 (or vice versa). The surface treatment is performed after the placement of the mask so that the first grating sections 1610 are treated but the second grating sections 1620 are not treated. The surface treatment may change the chemical affinity of the first grating sections 1610 or the second grating sections 1620 to different materials. Taking the second grating sections 1620 as an example, the second material 1720 over the second grating sections 1620 may have a stronger chemical affinity to blocks of polymer A in the triblock copolymer than the block of polymer B. As another example, the second material 1720 may have a stronger chemical affinity to the polymer in the polymer nanocomposite than the nanoparticle in the polymer nanocomposite.

FIG. 18 shows forming a repetitive structure layer 1800 over the grating layer 1600 based on the guiding pattern. The repetitive structure layer 1800 has a repetitive structure including a first element 1810 and second element 1820. The repetitive structure corresponds to the guiding pattern in the guiding pattern layer 1700. As shown in FIG. 18, the second element 1820 is formed on the first material 1710 and not on the second material 1720, e.g., due to a stronger chemical affinity of the second element 1820 to the first material 1710.

The repetitive structure layer 1800 may be the repetitive structure layer 1410 described above in conjunction with FIGS. 12-15. In an embodiment, the repetitive structure is the lamellar structure 130, the first element 1810 is lamellae 140 and 160 of polymer A, and the second element 1820 is lamella 150 of polymer B. In another embodiment, the repetitive structure is the cylindrical structure 740, the first element 1810 is the polymer cylinder 750, and the second element 1820 is the nanoparticle cylinder 760.

Figure 20:
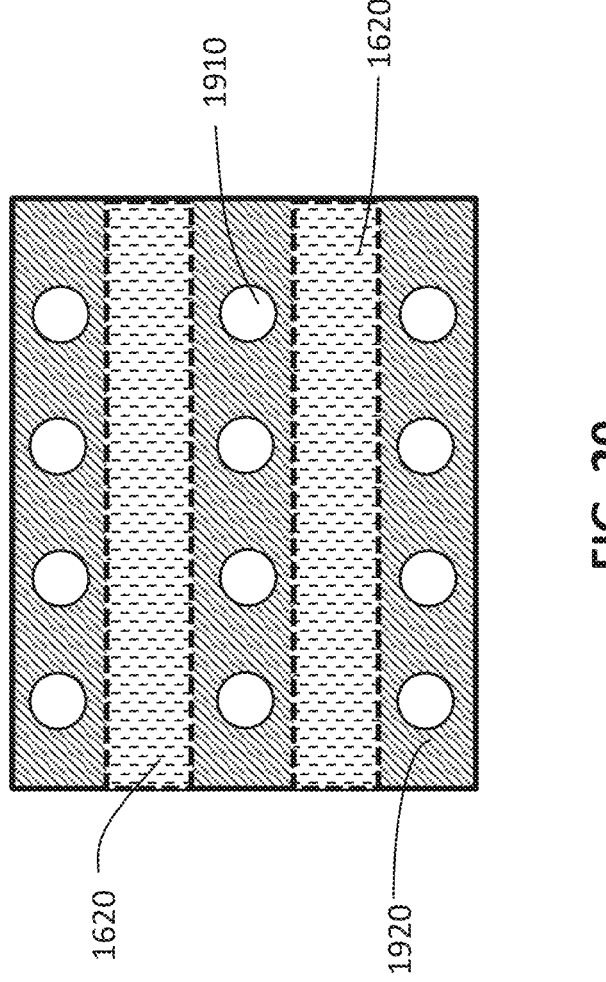

FIG. 19 shows forming a via opening layer 1900 from the repetitive structure layer 1800. FIG. 20 is a top view of the via opening layer 1900. In FIG. 19, the second element 1820 is removed from the repetitive structure layer 1800 to form via openings 1910. The via openings 1910 are defined by via opening wall 1910 which includes the first element 1810. As the second element 1820 is over the first material 1710, which is over the first grating section 1610, the via openings are formed over the first grating section 1610, not over the second grating section 1620, which is shown in FIG. 20. Accordingly, the grating pattern in the grating layer 1600 defines locations of the via openings 1920. In some embodiments, some or all of the via openings 1910 may be partially or completely filled with an electrically conductive material to form vias, so that the locations of the vias are also defined by the grating pattern.

Figures 21, 22:
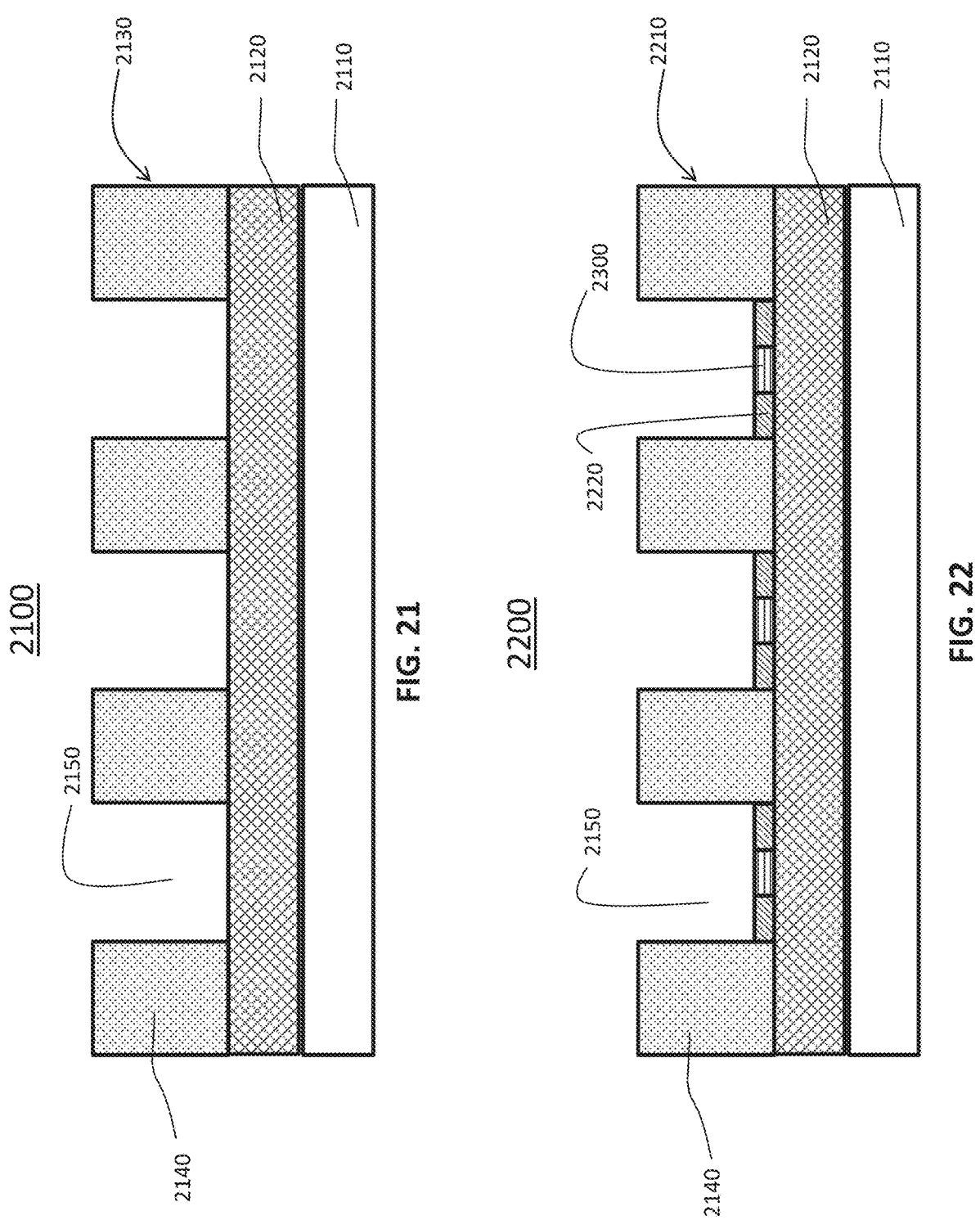
FIGS. 21-24 illustrate a process of forming via openings by using mixed epitaxy, in accordance with some embodiments.

FIGS. 21-24 illustrate a process of forming via openings 2420 by using mixed epitaxy, in accordance with some embodiments. Mixed epitaxy is a combination of grapho-epitaxy and chemoepitaxy. FIG. 21 shows an IC device 2100. The IC device 2100 includes a substrate 2110, an intermediate layer 2120 over (e.g., attached on) the substrate 2110, and a guiding pattern layer 2130 over the intermediate layer 2120. In other embodiments, the IC device 2100 may include different components. For instance, the IC device 2100 may not include the intermediate layer 2120 and the guiding pattern layer 2130 is formed on the substrate 2110.

The substrate 2110 may include a semiconductor material. Examples of the semiconductor material include, for example, single crystal silicon, polycrystalline silicon, SOI, other suitable semiconductor material, or some combination thereof. The substrate 2110 may also include other materials, such as metal, dielectric, dopant, and so on. In some embodiments, the substrate 2110 may include various IC components, such as transistors, etc. In some embodiments, the substrate 2110 is a general workpiece object used to manufacture integrated circuits.

The intermediate layer 2120 includes a dielectric or insulating material. Examples of the dielectric material include, for example, oxides of silicon (e.g., silicon dioxide (SiO)), doped oxides of silicon, fluorinated oxides of silicon, carbon doped oxides of silicon, various low-k dielectric materials known in the arts, and combinations thereof. The dielectric layer may be formed by conventional techniques, such as, for example, CVD, PVD, or by other deposition methods. In an embodiment, the intermediate layer 2120 includes a grating pattern that guides self-assembly of the lamellar triblock copolymer.

The guiding pattern layer 2130 includes a topographical guiding pattern. The topographical guiding pattern directs self-assembly of a lamellar triblock copolymer or formation of a cylindrical polymer composite. In some embodiments, the topographical guiding pattern directs self-assembly of the lamellar triblock copolymer or formation of the cylindrical polymer composite through mechanisms such as commensurability, lateral ordering, confinement effects, etc. In FIG. 21, the topographical guiding pattern is an alternative pattern of guiding walls 2140 (individually referred to as "guiding wall 2140") and openings 2150 (individually referred to as "opening 2150"). Each opening 2150 is between two guiding walls 2140 that defines the opening 2150. In some embodiments, the guiding pattern layer 2130 is formed by using EUV, immersion lithography (e.g., by using UV light at 193 nm wavelength), deep UV lithography (e.g., dry 193 nm photolithography), other types of lithography techniques. The topographical guiding pattern is three-dimensional. The openings 2150 provide space for DSA of the lamellar triblock copolymer. In some embodiments, the guiding pattern layer 2130 may be physically tailored or chemically modified to impose different affinity to different polymer blocks of the lamellar triblock copolymer to enforce the orientation of the lamellar triblock copolymer, which is perpendicular to the intermediate layer 2120.

FIG. 22 shows an IC device 2200 including a mixed guiding pattern layer 2210. The mixed guiding pattern layer 2210 is formed by forming a chemical guiding pattern in each of the openings 2150 of the IC device 2100. In FIG. 22, the chemical guiding pattern is an alternative pattern of first sections 2220 (individually referred to as "first section 2220") and second sections 2230 (individually referred to as "second section 2230"). Each second section 2230 is between two first sections 2220 that defines the second section 2230. The first sections 2220 have different chemical properties from the second sections 2230. In embodiments where a triblock copolymer is used, the first section 2220 or second section 2230 has different chemical affinity to different polymer blocks of the triblock copolymer to enforce the orientation of the lamellar triblock copolymer, which is perpendicular to the intermediate layer 2120. In embodiments where the polymer nanocomposite is used, the first section 2220 or second section 2230 has different chemical affinity to the polymer and the nanocomposite in the polymer nanocomposite. Accordingly, the chemical guiding pattern can guide self-assembly of the triblock copolymer and the polymer nanocomposite. In an embodiment, the first sections 2220 include a different material from the second sections 2230.

Figures 23, 24:
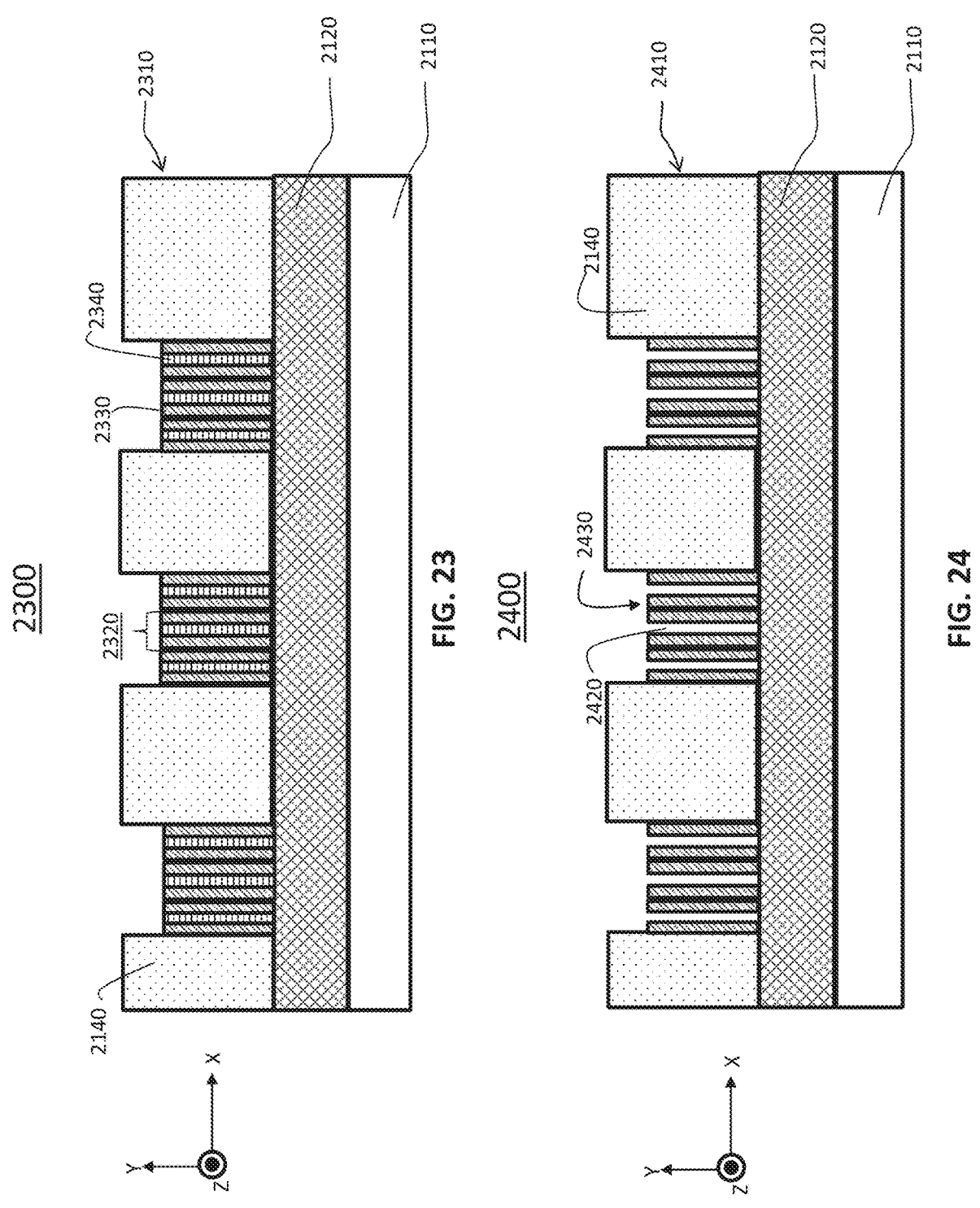

FIG. 23 shows an IC device 2300 generated by forming a repetitive structure layer 2310 based on the mixed guiding pattern. The repetitive structure layer 2310 includes a plurality of structures 2320 (individually referred to as "structure 2320") formed in the openings 2150. The structures 2320 may be formed by applying a triblock copolymer or a polymer nanocomposite in the openings 2150 with the chemical guiding pattern. In FIG. 23, each opening 2510 is filled with three structures 2320. In other embodiments, an opening 2510 may be filled with a different number of structures 2320. A structure 2320 includes a first element 2330 and second element 2340.

In some embodiments, the repetitive structure layer 2310 is formed by using the triblock copolymer. For instance, the triblock copolymer is deposited in the openings 2150 of the mixed guiding pattern layer 2210. The topographical and chemical guiding patterns of the mixed guiding pattern layer 2210 guide microphase separation of the triblock copolymer. The self-assembly of the triblock copolymer may be drive by the guiding walls 2140 and the differentiated chemical affinity of the first sections 2220 or second sections 2230. In other embodiments, the repetitive structure layer 2310 may be formed by using the polymer nanocomposite. A structure 2320 is a cylindrical structure, e.g., the cylindrical structure 740 in FIG. 7B. The first element 2330 may be the polymer cylinder 750 and the second element 2340 may be the nanoparticle cylinder 760 in FIG. 7B. The topographical and chemical guiding patterns of the mixed guiding pattern layer 2210. The cylindrical structures are aligned relative to the guiding walls 2140 and the second sections 2230, which achieves a better alignment compared with lithographical alignment and therefore, can be used to form very small via openings (e.g., nanoscale).

The alignment of the structures 2320 is based on both the topographical guiding pattern and chemical guiding pattern and therefore, can be better than an alignment based on the topographical guiding pattern or chemical guiding pattern alone. In some embodiments, an annealing treatment may be applied to the triblock copolymer or polymer nanocomposite in order to initiate, accelerate, or otherwise promote the formation of the structures 2320. The annealing treatment may include a treatment that is operable to increase a temperature of the polymer nanocomposite.

FIG. 24 shows an IC device 2400 including a via opening layer 2410, in which via openings 2420 (individually referred to as "via opening 2410") are formed. The via openings 2420 are defined by the via opening walls 2430 (individually referred to as "via opening wall 2430"). A via opening 2420 is formed by removing the second element 2340 from a structure 2320. The via opening walls 2430 of the via opening 2420 are the first element 2330 of the structure 2320. The embodiment of FIG. 24 removes the second element 2340 from all the structures 2320. In other embodiments, the second element 2340 is removed from a subset of the structures 2320. FIG. 24 shows removal of the whole second element 2340. In other embodiments, a via opening 520 may be formed by removing a portion of the second element 2340. In some embodiments, the ratio of the length of the structures 2320 along the Y axis to the length of the via openings 2420 along the Y axis is in a range from 0.3 to 2.0. In some embodiments, some or all of the via openings 2420 may be partially or completely filled with an electrically conductive material to form vias.

In some embodiments, the second element 2340 is removed by performing an etching process (e.g., a selective etching process) on the repetitive structure layer 2310. The second element 2340 is etched at a higher rate than the first element 2330. The first element 2330 may remain substantially unetched after the etching process. In an embodiment, the etching process includes an isotropic chemically selective etch.

FIG. 25 is a flowchart illustrating a process 2500 of using a lamellar triblock copolymer to rectify via openings, in accordance with various embodiments. The process 2500 includes forming 2510 a guiding pattern on a surface of a layer of the IC device. The process also includes forming 2520 a plurality of lamellar structures based on the guiding pattern by applying a triblock copolymer in a lamellar phase to the surface of the layer. An individual one of the plurality of lamellar structures includes a first lamella, a second lamella, and a third lamella. The second lamella is between the first lamella and the third lamella. The process further includes forming 2530 the via openings (such as contact holes) by removing the second lamella from at least some (e.g., all) of the lamellar structures.

FIG. 26 is a flowchart illustrating a process 2600 of using a polymer nanocomposite to rectify via openings, in accordance with various embodiments. The process 2600 includes forming 2610 a guiding pattern on a surface of a layer of the IC device. The process 2600 also includes forming 2620 a plurality of structures based at least on the guiding pattern by applying a polymer nanocomposite material on the surface of the layer. The polymer nanocomposite material includes a nanoparticle and polymer chains attached on the nanoparticle. The process 2600 further includes forming 2630 via openings (such as contact holes) by removing the nanoparticle from the structures.

Figure 27:
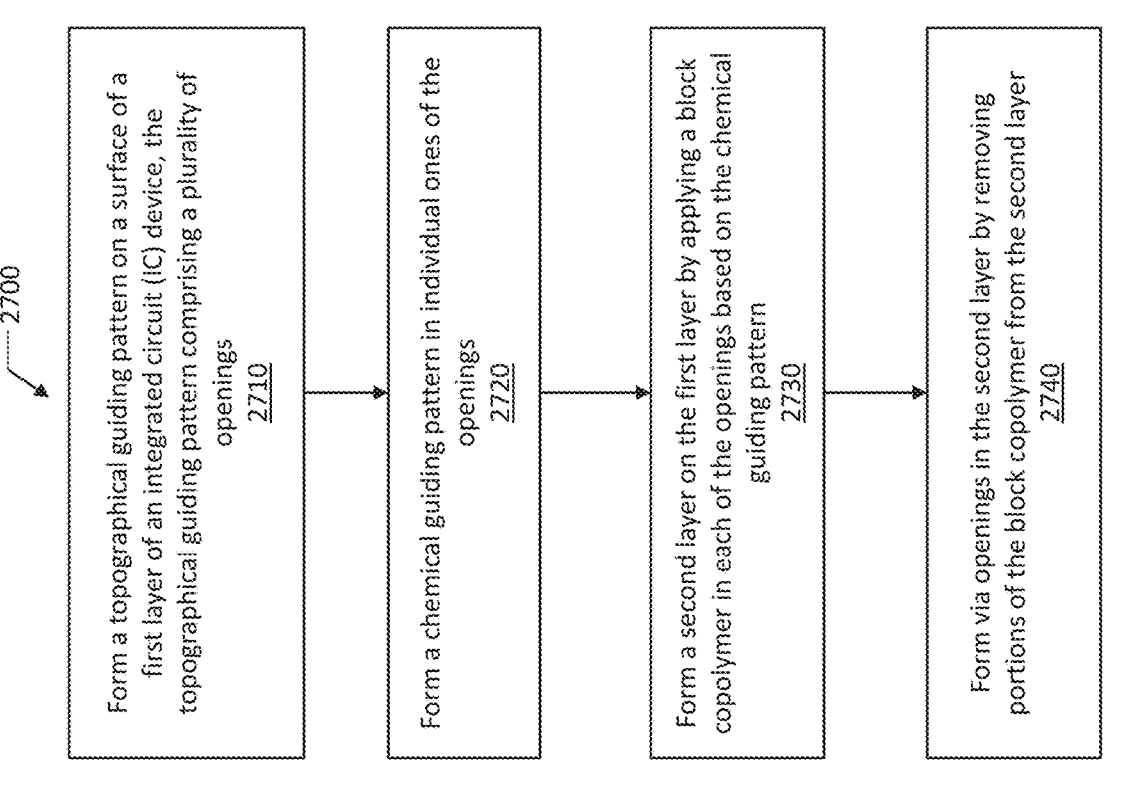
FIG. 27 is a flowchart illustrating a process of using mixed epitaxy to rectify via openings, in accordance with various embodiments.

FIG. 27 is a flowchart illustrating a process 2700 of using mixed epitaxy to rectify via openings, in accordance with various embodiments. The process 2700 includes forming

2710 a topographical guiding pattern on a surface of a first layer of the IC device, the topographical guiding pattern comprising a plurality of openings (the topographical guiding pattern may further include a plurality of guiding walls defining the openings). The process 2700 also includes forming 2720 a chemical guiding pattern in individual ones of the openings of the topographical guiding pattern (e.g., the chemical guiding pattern comprising a plurality of first sections and a plurality of second sections, wherein the first sections include a first material, and the second sections include a second material that is different from the first material). The process 2700 also includes forming 2730 a second layer (e.g., forming the second layer on the first layer) by applying a block copolymer in the openings with the chemical guiding pattern. The process 2700 further includes forming 2740 the via openings (such as contact holes) in the second layer by removing portions of the block copolymer from the second layer.

Figures 28A, 28B:
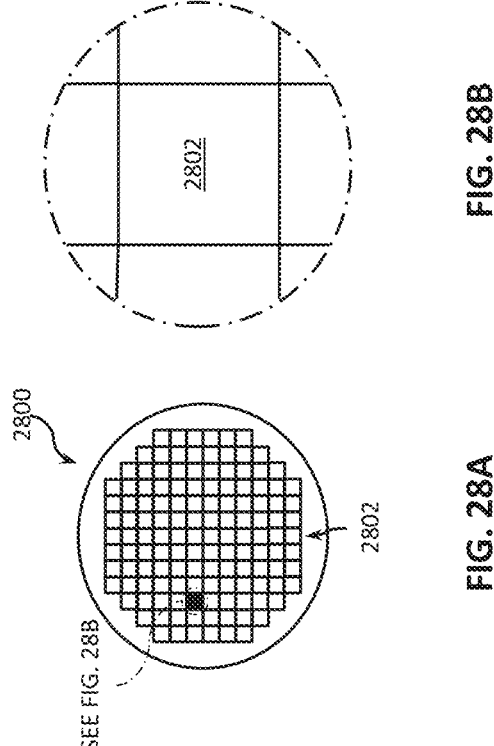
FIGS. 28A-28B are top views of a wafer and dies that may include one or more via openings in accordance with any of the embodiments disclosed herein.

FIGS. 28A-28B are top views of a wafer 2800 and dies 2802 that may include one or more via openings in accordance with any of the embodiments disclosed herein. In some embodiments, the dies 2802 may be included in an IC package, in accordance with any of the embodiments disclosed herein. For example, any of the dies 2802 may serve as any of the dies 2256 in an IC package 2980 shown in FIG. 29. The wafer 2800 may be composed of semiconductor material and may include one or more dies 2802 having IC structures formed on a surface of the wafer 2800. Each of the dies 2802 may be a repeating unit of a semiconductor product that includes any suitable IC (e.g., ICs including one or more via openings as described herein). After the fabrication of the semiconductor product is complete (e.g., after manufacture of one or more via openings as described herein, e.g., after manufacture of any embodiment of the IC devices described herein), the wafer 2800 may undergo a singulation process in which each of the dies 2802 is separated from one another to provide discrete "chips" of the semiconductor product. In particular, devices that include one or more via openings as disclosed herein may take the form of the wafer 2800 (e.g., not singulated) or the form of the die 2802 (e.g., singulated). The die 2802 may include one or more diodes, one or more transistors as well as, optionally, supporting circuitry to route electrical signals to the diodes and transistors, as well as any other IC components. In some embodiments, the wafer 2800 or the die 2802 may implement an ESD protection device, an RF FE device, a memory device (e.g., a static random-access memory (SRAM) device), a logic device (e.g., an AND, OR, NAND, or NOR gate), or any other suitable circuit element. Multiple ones of these devices may be combined on a single die 2802.

Figure 29:
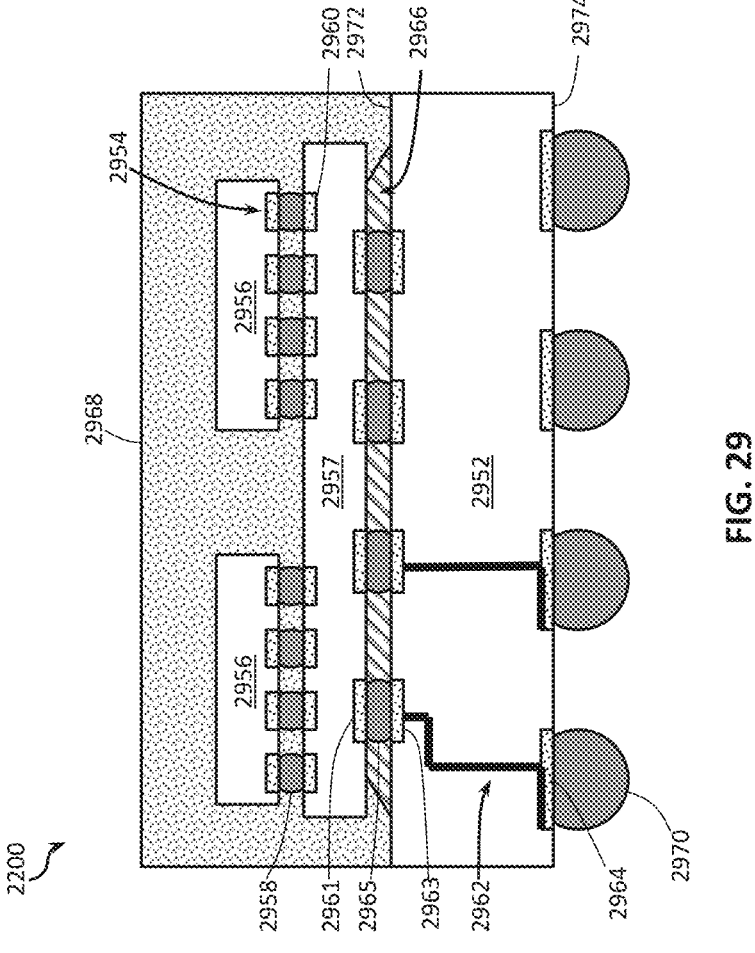
FIG. 29 is a side, cross-sectional view of an example IC package that may include one or more IC devices having one or more via openings in accordance with any of the embodiments disclosed herein.

FIG. 29 is a side, cross-sectional view of an example IC package 2900 that may include one or more IC devices having one or more via openings in accordance with any of the embodiments disclosed herein. In some embodiments, the IC package 2900 may be a system-in-package (SiP).

As shown in FIG. 29, the IC package 2900 may include a package substrate 2952. The package substrate 2952 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2972 and the face 2974, or between different locations on the face 2972, and/or between different locations on the face 2974.

The package substrate 2952 may include conductive contacts 2963 that are coupled to conductive pathways 2962 through the package substrate 2952, allowing circuitry within the dies 2956 and/or the interposer 2957 to electrically couple to various ones of the conductive contacts 2964 (or to other devices included in the package substrate 2952, not shown).

The IC package 2900 may include an interposer 2957 coupled to the package substrate 2952 via conductive contacts 2961 of the interposer 2957, first-level interconnects 2965, and the conductive contacts 2963 of the package substrate 2952. The first-level interconnects 2965 illustrated in FIG. 29 are solder bumps, but any suitable first-level interconnects 2965 may be used. In some embodiments, no interposer 2957 may be included in the IC package 2900; instead, the dies 2956 may be coupled directly to the conductive contacts 2963 at the face 2972 by first-level interconnects 2965.

The IC package 2900 may include one or more dies 2956 coupled to the interposer 2957 via conductive contacts 2954 of the dies 2956, first-level interconnects 2958, and conductive contacts 2960 of the interposer 2957. The conductive contacts 2960 may be coupled to conductive pathways (not shown) through the interposer 2957, allowing circuitry within the dies 2956 to electrically couple to various ones of the conductive contacts 2961 (or to other devices included in the interposer 2957, not shown). The first-level interconnects 2958 illustrated in FIG. 29 are solder bumps, but any suitable first-level interconnects 2958 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2966 may be disposed between the package substrate 2952 and the interposer 2957 around the first-level interconnects 2965, and a mold compound 2968 may be disposed around the dies 2956 and the interposer 2957 and in contact with the package substrate 2952. In some embodiments, the underfill material 2966 may be the same as the mold compound 2968. Example materials that may be used for the underfill material 2966 and the mold compound 2968 are epoxy mold materials, as suitable. Second-level interconnects 2970 may be coupled to the conductive contacts 2964. The second-level interconnects 2970 illustrated in FIG. 29 are solder balls (e.g., for a ball grid array arrangement), but any suitable second-level interconnects 29770 may be used (e.g., pins in a pin grid array arrangement or lands in a land grid array arrangement). The second-level interconnects 2970 may be used to couple the IC package 2900 to another component, such as a circuit board (e.g., a motherboard), an interposer, or another IC package, as known in the art and as discussed below with reference to FIG. 29.

The dies 2956 may take the form of any of the embodiments of the die 2802 discussed herein and may include any of the embodiments of an IC device having one or more via openings, e.g., any of the IC devices described herein. In embodiments in which the IC package 2900 includes multiple dies 2956, the IC package 2900 may be referred to as a multi-chip package. Importantly, even in such embodiments of an MCP implementation of the IC package 2900, one or more via openings may be provided in a single chip, in accordance with any of the embodiments described herein. The dies 2956 may include circuitry to perform any desired functionality. For example, one or more of the dies 2956 may be ESD protection dies, including one or more via openings as described herein, one or more of the dies 2956 may be logic dies (e.g., silicon-based dies), one or more of the dies 2956 may be memory dies (e.g., high bandwidth memory), etc. In some embodiments, any of the dies 2956 may include one or more via openings, e.g., as discussed above; in some embodiments, at least some of the dies 2956 may not include any via openings.

The IC package 2900 illustrated in FIG. 29 may be a flip chip package, although other package architectures may be used. For example, the IC package 2900 may be a ball grid array (BGA) package, such as an embedded wafer-level ball grid array (eWLB) package. In another example, the IC package 2900 may be a wafer-level chip scale package (WLCSP) or a panel fan-out (FO) package. Although two dies 2956 are illustrated in the IC package 2900 of FIG. 29, an IC package 2900 may include any desired number of the dies 2956. An IC package 2900 may include additional passive components, such as surface-mount resistors, capacitors, and inductors disposed on the first face 2972 or the second face 2974 of the package substrate 2952, or on either face of the interposer 2957. More generally, an IC package 2900 may include any other active or passive components known in the art.

Figure 30:
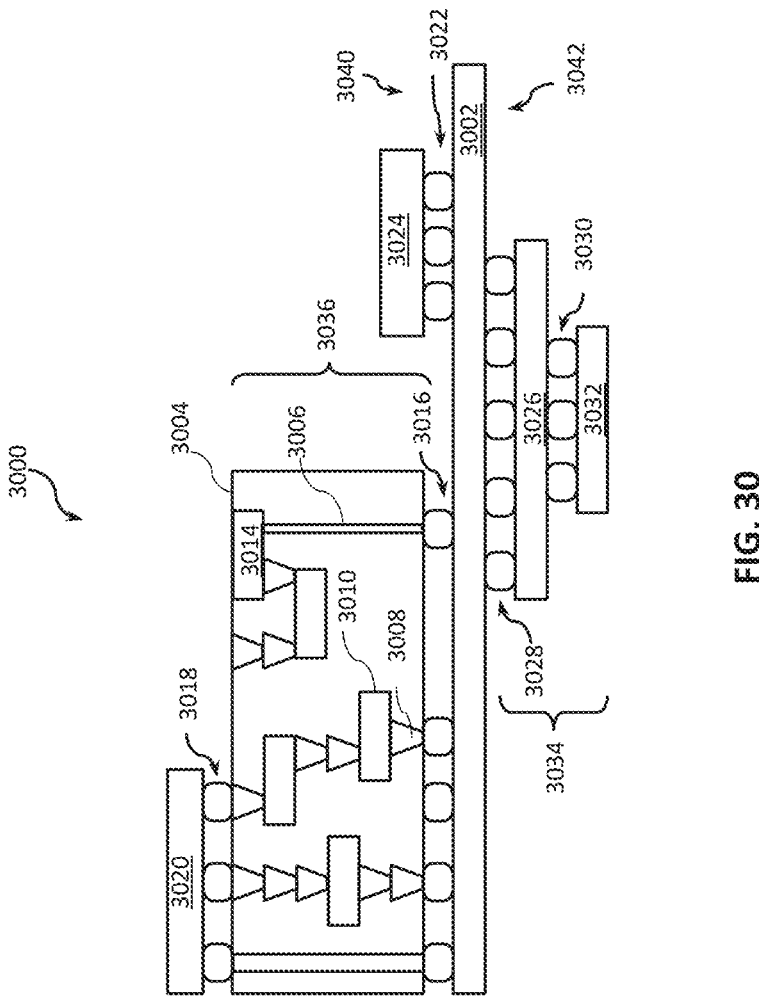
FIG. 30 is a cross-sectional side view of an IC device assembly that may include components having one or more IC devices implementing one or more via openings in accordance with any of the embodiments disclosed herein.

FIG. 30 is a cross-sectional side view of an IC device assembly 3000 that may include components having one or more IC devices implementing one or more via openings in accordance with any of the embodiments disclosed herein. The IC device assembly 3000 includes a number of components disposed on a circuit board 3002 (which may be, e.g., a motherboard). The IC device assembly 3000 includes components disposed on a first face 3040 of the circuit board 3002 and an opposing second face 3042 of the circuit board 3002; generally, components may be disposed on one or both faces 3040 and 3042. In particular, any suitable ones of the components of the IC device assembly 3000 may include any of the IC devices implementing one or more via openings in accordance with any of the embodiments disclosed herein; e.g., any of the IC packages discussed below with reference to the IC device assembly 3000 may take the form of any of the embodiments of the IC package 2900 discussed above with reference to FIG. 29 (e.g., may include one or more via openings in a die 2956).

In some embodiments, the circuit board 3002 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 3002. In other embodiments, the circuit board 3002 may be a non-PCB substrate.

The IC device assembly 3000 illustrated in FIG. 30 includes a package-on-interposer structure 3036 coupled to the first face 3040 of the circuit board 3002 by coupling components 3016. The coupling components 3016 may electrically and mechanically couple the package-on-interposer structure 3036 to the circuit board 3002, and may include solder balls (e.g., as shown in FIG. 30), male and female portions of a socket, an adhesive, an underfill material, and/or any other suitable electrical and/or mechanical coupling structure.

The package-on-interposer structure 3036 may include an IC package 3020 coupled to an interposer 3004 by coupling components 3018. The coupling components 3018 may take any suitable form for the application, such as the forms discussed above with reference to the coupling components 3016. The IC package 3020 may be or include, for example, a die (the die 2802 of FIG. 28B), an IC device (e.g., the IC devices described above), or any other suitable component. In particular, the IC package 3020 may include one or more via openings as described herein. Although a single IC package 3020 is shown in FIG. 30, multiple IC packages may be coupled to the interposer 3004; indeed, additional interposers may be coupled to the interposer 3004. The interposer 3004 may provide an intervening substrate used to bridge the circuit board 3002 and the IC package 3020. Generally, the interposer 3004 may spread a connection to a wider pitch or reroute a connection to a different connection. For example, the interposer 3004 may couple the IC package 3020 (e.g., a die) to a BGA of the coupling components 3016 for coupling to the circuit board 3002. In the embodiment illustrated in FIG. 30, the IC package 3020 and the circuit board 3002 are attached to opposing sides of the interposer 3004; in other embodiments, the IC package 3020 and the circuit board 3002 may be attached to a same side of the interposer 3004. In some embodiments, three or more components may be interconnected by way of the interposer 3004.

The interposer 3004 may be formed of an epoxy resin, a fiberglass-reinforced epoxy resin, a ceramic material, or a polymer material such as polyimide. In some implementations, the interposer 3004 may be formed of alternate rigid or flexible materials that may include the same materials described above for use in a semiconductor substrate, such as silicon, germanium, and other group III-V and group IV materials. The interposer 3004 may include metal interconnects 3008 and vias 3010, including but not limited to through-silicon vias (TSVs) 3006. The interposer 3004 may further include embedded devices 3014, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and micro-electromechanical systems (MEMS) devices may also be formed on the interposer 3004. In some embodiments, the IC devices implementing one or more via openings as described herein may also be implemented in/on the interposer 3004. The package-on-interposer structure 3036 may take the form of any of the package-on-interposer structures known in the art.

The IC device assembly 3000 may include an IC package 3024 coupled to the first face 3040 of the circuit board 3002 by coupling components 3022. The coupling components 3022 may take the form of any of the embodiments discussed above with reference to the coupling components 3016, and the IC package 3024 may take the form of any of the embodiments discussed above with reference to the IC package 3020.

The IC device assembly 3000 illustrated in FIG. 30 includes a package-on-package structure 3034 coupled to the second face 3042 of the circuit board 3002 by coupling components 3028. The package-on-package structure 3034 may include an IC package 3026 and an IC package 3032 coupled together by coupling components 3030 such that the IC package 3026 is disposed between the circuit board 3002 and the IC package 3032. The coupling components 3028 and 3030 may take the form of any of the embodiments of the coupling components 3016 discussed above, and the IC packages 3026 and 3032 may take the form of any of the embodiments of the IC package 3020 discussed above. The package-on-package structure 3034 may be configured in accordance with any of the package-on-package structures known in the art.

Figure 31:
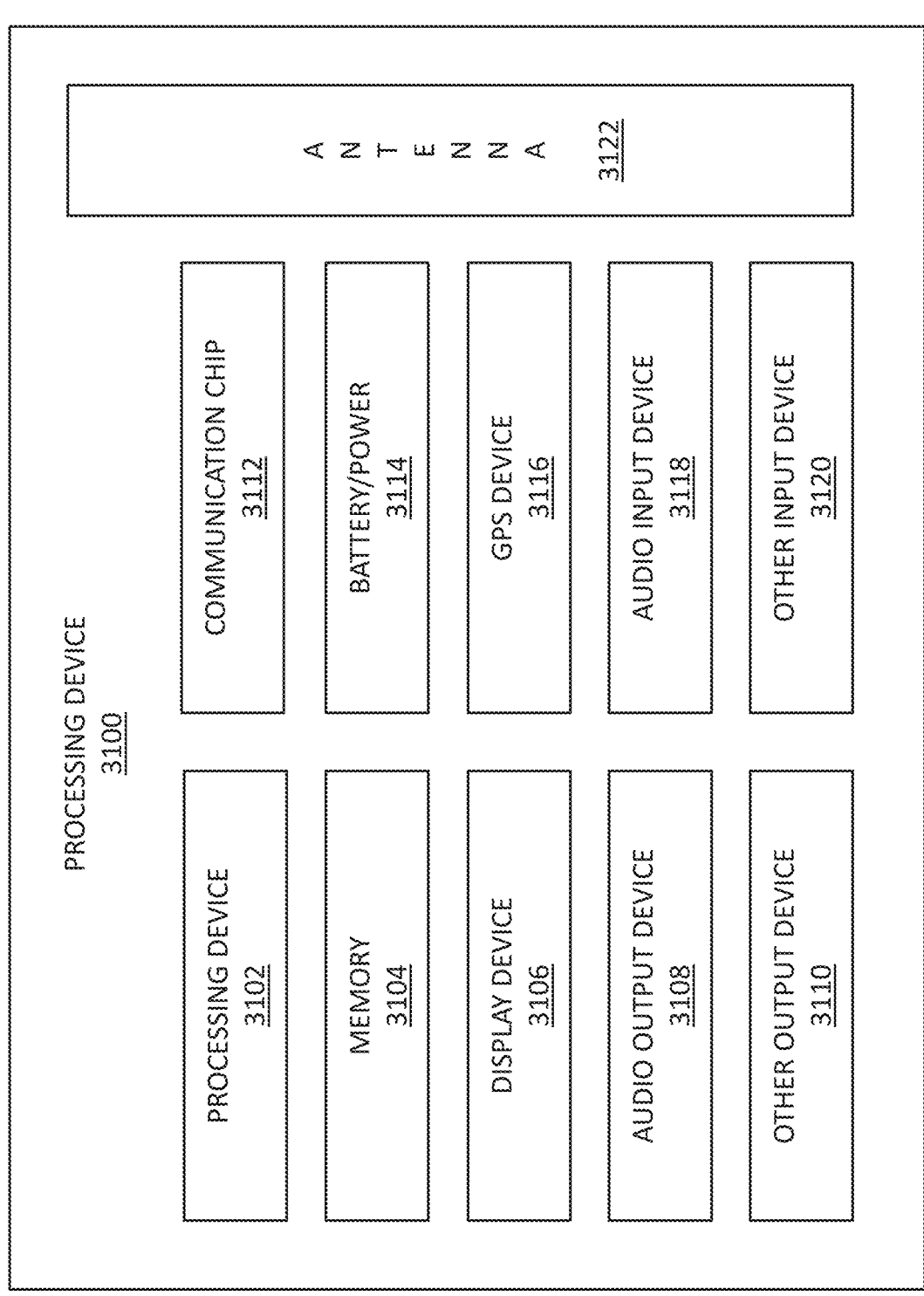
FIG. 31 is a block diagram of an example computing device that may include one or more integrated circuit (IC) devices with via openings rectified by using a lamellar triblock copolymer, a polymer nanocomposite, or mixed epitaxy, in accordance with various embodiments.

FIG. 31 is a block diagram of an example computing device 3100 that may include one or more components with one or more transistor arrangements fabricated using place-holders for backside contact formation in accordance with any of the embodiments disclosed herein. For example, any suitable ones of the components of the computing device 3100 may include a die (e.g., the die 2802 of FIG. 28B) including one or more via openings in accordance with any of the embodiments disclosed herein. Any of the components of the computing device 3100 may include an IC device (e.g., any embodiment of the IC devices of FIGS. 1-24) and/or an IC package (e.g., the IC package 2900 of FIG. 29). Any of the components of the computing device 3100 may include an IC device assembly (e.g., the IC device assembly 3000 of FIG. 30). A number of components are illustrated in FIG. 31 as included in the computing device 3100, but any one or more of these components may be omitted or duplicated, as suitable for the application. In some embodiments, some or all of the components included in the computing device 3100 may be attached to one or more motherboards. In some embodiments, some or all of these components are fabricated onto a single system on a chip (SoC) die.

Additionally, in various embodiments, the computing device 3100 may not include one or more of the components illustrated in FIG. 31, but the computing device 3100 may include interface circuitry for coupling to the one or more components. For example, the computing device 3100 may not include a display device 3106, but may include display device interface circuitry (e.g., a connector and driver circuitry) to which a display device 3106 may be coupled. In another set of examples, the computing device 3100 may not include an audio input device 3118 or an audio output device 3108, but may include audio input or output device interface circuitry (e.g., connectors and supporting circuitry) to which an audio input device 3118 or audio output device 3108 may be coupled.

The computing device 3100 may include a processing device 3102 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 3102 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 3100 may include a memory 3104, which may itself include one or more memory devices such as volatile memory (e.g., DRAM), nonvolatile memory (e.g., read-only memory (ROM)), flash memory, solid state memory, and/or a hard drive. In some embodiments, the memory 3104 may include memory that shares a die with the processing device 3102.

In some embodiments, the computing device 3100 may include a communication chip 3112 (e.g., one or more communication chips). For example, the communication chip 3112 may be configured for managing wireless communications for the transfer of data to and from the computing device 3100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 3112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 3112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 3112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 3112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 3112 may operate in accordance with other wireless protocols in other embodiments. The computing device 3100 may include an antenna 3122 to facilitate wireless communications and/or to receive other wireless communications (such as AM or FM radio transmissions).

In some embodiments, the communication chip 3112 may manage wired communications, such as electrical, optical, or any other suitable communication protocols (e.g., the Ethernet). As noted above, the communication chip 3112 may include multiple communication chips. For instance, a first communication chip 3112 may be dedicated to shorter-range wireless communications such as Wi-Fi or Bluetooth, and a second communication chip 3112 may be dedicated to longer-range wireless communications such as global positioning system (GPS), EDGE, GPRS, CDMA, WiMAX, LTE, EV-DO, or others. In some embodiments, a first communication chip 3112 may be dedicated to wireless communications, and a second communication chip 3112 may be dedicated to wired communications.

The computing device 3100 may include battery/power circuitry 3114. The battery/power circuitry 3114 may include one or more energy storage devices (e.g., batteries or capacitors) and/or circuitry for coupling components of the computing device 3100 to an energy source separate from the computing device 3100 (e.g., AC line power).

The computing device 3100 may include a display device 3106 (or corresponding interface circuitry, as discussed above). The display device 3106 may include any visual indicators, such as a heads-up display, a computer monitor, a projector, a touchscreen display, a liquid crystal display (LCD), a light-emitting diode display, or a flat panel display, for example.

The computing device 3100 may include an audio output device 3108 (or corresponding interface circuitry, as discussed above). The audio output device 3108 may include any device that generates an audible indicator, such as speakers, headsets, or earbuds, for example.

The computing device 3100 may include an audio input device 3118 (or corresponding interface circuitry, as discussed above). The audio input device 3118 may include any device that generates a signal representative of a sound, such as microphones, microphone arrays, or digital instruments (e.g., instruments having a musical instrument digital interface (MIDI) output).

The computing device 3100 may include a GPS device 3116 (or corresponding interface circuitry, as discussed above). The GPS device 3116 may be in communication with a satellite-based system and may receive a location of the computing device 3100, as known in the art.

The computing device 3100 may include an other output device 3110 (or corresponding interface circuitry, as discussed above). Examples of the other output device 3110 may include an audio codec, a video codec, a printer, a wired or wireless transmitter for providing information to other devices, or an additional storage device.

The computing device 3100 may include an other input device 3120 (or corresponding interface circuitry, as discussed above). Examples of the other input device 3120 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 3100 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 3100 may be any other electronic device that processes data.

SELECT EXAMPLES

The following paragraphs provide various examples of the embodiments disclosed herein.

Example 1 provides an IC device. The IC device includes a first layer; and a second layer adjoining the first layer, the second layer including a plurality of lamellar structures, where an individual one of the lamellar structures includes a first lamella including a first block of a triblock copolymer, a second lamella including a second block of the triblock copolymer, and a via between the first and second lamellae, where the first and second lamellae are electrically insulating, and the via includes an electrically conductive material.

Example 2 provides the IC device according to example 1, where the first lamella and the second lamella comprise a same polymer.

Example 3 provides the IC device according to example 2, where the same polymer is selected from a group consisting of polyethylene, polystyrene, polyvinylchloride, polytetrafluorethylene, polydimethylsiloxane, some polyesters, some polyurethanes, acrylics, epoxies, P(t-Butyl Acrylate), polyacrylic acid, polyacrylamide, maleic anhydride polymers, polyethylene, polypropylene, polyacrylonitrile, polybutadiene, polyvinyl acetate, polyacetic acid, polybutyl acrylate, polylactic acid, polycaprolactone, poly(ethylene glycol), and polyisoprene.

Example 4 provides the IC device according to any of the proceeding examples, where the first layer includes a plurality of first sections including a first material and a plurality of second sections including a second material that is different from the first material, and the via is in a portion of the second layer that adjoins one of the first sections of the first layer.

Example 5 provides the IC device according to example 4, where the first material is a dielectric material, and the second material is a metal or metal compound.

Example 6 provides the IC device according to example 4, where the first material is a resist material, and the second material is a non-resist material.

Example 7 provides the IC device according to any of the proceeding examples, where an orientation of the lamellar structures is perpendicular to a surface of the first layer.

Example 8 provides the IC device according to any of the proceeding examples, where a ratio of a length of the lamellar structures along a direction perpendicular to the surface of the second layer to a length of the via along the direction is in a range from 0.3 to 2.0.

Example 9 provides the IC device according to any of the proceeding examples, where the via includes a conductive material.

Example 10 provides the IC device according to any of the proceeding examples, where the via is a through via, a buried via, or a blind via.

Example 11 provides an IC package. The IC package includes the IC device according to any of the proceeding examples; and a further IC component, coupled to the IC device.

Example 12 provides the IC package according to example 11, where the further IC component includes one of a package substrate, an interposer, or a further IC die.

Example 13 provides the IC package according to example 11 or 12, where the IC device according to any one of examples 1-10 may include, or be a part of, at least one of a memory device, a computing device, a wearable device, a handheld electronic device, and a wireless communications device.

Example 14 provides an electronic device. The electronic device includes a carrier substrate; and one or more of the IC devices according to any one of examples 1-10 and the IC package according to any one of examples 11-13, coupled to the carrier substrate.

Example 15 provides the electronic device according to example 14, where the carrier substrate is a motherboard.

Example 16 provides the electronic device according to example 14, where the carrier substrate is a PCB.

Example 17 provides the electronic device according to any one of examples 14-16, where the electronic device is a wearable electronic device or handheld electronic device.

Example 18 provides the electronic device according to any one of examples 14-17, where the electronic device further includes one or more communication chips and an antenna.

Example 19 provides the electronic device according to any one of examples 14-18, where the electronic device is an RF transceiver.

Example 20 provides the electronic device according to any one of examples 14-18, where the electronic device is one of a switch, a power amplifier, a low-noise amplifier, a filter, a filter bank, a duplexer, an upconverter, or a downconverter of an RF communications device, e.g., of an RF transceiver.

Example 21 provides the electronic device according to any one of examples 14-18, where the electronic device is a computing device.

Example 22 provides the electronic device according to any one of examples 14-21, where the electronic device is included in a base station of a wireless communication system.

Example 23 provides the electronic device according to any one of examples 14-21, where the electronic device is included in a user equipment device of a wireless communication system.

Example 24 provides a method of forming contact holes for an integrated circuit (IC) device, the method including: forming a guiding pattern on a surface of a layer of the IC device; forming a plurality of lamellar structures based on the guiding pattern by applying a triblock copolymer in a lamellar phase to the surface of the layer, an individual one of the plurality of lamellar structures including a first lamella, a second lamella, and a third lamella, where the second lamella is between the first lamella and the third lamella; and forming the contact holes by removing the second lamella from at least some of the lamellar structures.

Example 25 provides the method according to example 24, where the first lamella and the third lamella both include a first polymer, and the second lamella includes a second polymer that is different from the first polymer.

Example 26 provides the method according to example 21-35, where an orientation of the lamellar structures is perpendicular to the surface of the layer.

Example 27 provides the method according to any one of examples 24-26, where the layer includes a grating pattern, and forming the plurality of lamellar structures based at least on the guiding pattern by applying the triblock copolymer in the lamellar phase on the surface of the layer includes:

forming the plurality of lamellar structures based on the guiding pattern and the grating pattern of the layer by applying the triblock copolymer in the lamellar phase on the surface of the layer.

Example 28 provides the method according to example 27, where the grating pattern includes an alternating pattern of first sections and second sections, the first sections including a first material, the second sections including a second material that is different from the first material.

Example 29 provides the method according to example 28, where the contact holes are formed over at least some of the first sections in the layer.

Example 30 provides the method according to any one of examples 24-29, where a ratio of a length of the lamellar structures along a direction perpendicular to the surface of the layer to a length of the contact holes along the direction is in a range from 0.3 to 2.0.

Example 31 provides the method according to any one of examples 24-30, where the guiding pattern includes an alternating pattern of first sections and second sections; the guiding pattern is a chemical guiding pattern; the first sections include a first material; and the second sections include a second material that is different from the first material.

Example 32 provides the method according to any one of examples 24-31, where the guiding pattern includes an alternating pattern of first sections and second sections; the guiding pattern is a topographical guiding pattern; the second sections are openings; and the first sections are guiding walls defining the openings.

Example 33 provides the method according to examples 32, where forming the guiding pattern on the surface of the layer of the IC device includes forming a chemical guiding pattern in the openings, the chemical guiding pattern including an alternating pattern of third sections and fourth sections, where the third sections comprise a third material, and the fourth sections comprise a fourth material that is different from the third material.

Example 34 provides the method according to any one of examples 24-33, where forming the contact holes by removing the second lamella from at least some of the lamellar structures includes performing an etching process on at least some of the lamellar structures to etch the second lamella at a higher rate than etching the first and third lamellae.

Example 35 provides a method of forming contact holes for an integrated circuit (IC) device, the method including forming a topographical guiding pattern on a surface of a first layer of the IC device, the topographical guiding pattern including a plurality of openings; forming a chemical guiding pattern in individual ones of the openings of the topographical guiding pattern; forming a second layer by applying a block copolymer in the openings with the chemical guiding pattern; and forming the contact holes in the second layer by removing portions of the block copolymer from the second layer.

Example 36 provides the method according to example 35, where the block copolymer is a triblock copolymer in a lamellar phase.

Example 37 provides the method according to example 36, where the triblock copolymer in the lamellar phase includes a first lamella, a second lamella, and a third lamellar, the second lamella is between the first and third lamellae, the first and third lamellae include a first polymer, and the second lamella includes a second polymer that is different from the first polymer.

Example 38 provides the method according to any one of examples 35-37, where forming the chemical guiding pattern in the individual ones of the openings of the topographical guiding pattern includes forming the chemical guiding pattern based on a grating pattern in the first layer, where the grating pattern includes an alternative pattern of first sections and second sections.

Example 39 provides the method according to example 38, where forming the contact holes in the second layer by removing portions of the block copolymer from the second layer includes forming the contact holes in portions of the second layer that are over at least some of the first sections in the first layer.

Example 40 provides the method according to any one of the preceding examples, further including processes for forming the IC device according to any one of examples 1-10.

Example 41 provides the method according to any one of the preceding examples, further including processes for forming the IC package according to any one of the examples 11-13.

Example 42 provides the method according to any one of the preceding examples, further including processes for forming the electronic device according to any one of the examples 14-23.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
   a first layer; and
   a second layer adjoining the first layer, the second layer comprising a plurality of lamellar structures, an individual one of the lamellar structures comprising:
      a first lamella comprising a first block of a triblock copolymer, wherein the first lamella is electrically insulating,
      a second lamella comprising a second block of the triblock copolymer, wherein the second lamella is electrically insulating, and
      a via between the first and second lamellae, the via including an electrically conductive material,
   wherein a first surface of the via contacts a surface of the first lamellae, a second surface of the via contacts a surface of the second lamellae, and the first surface of the via opposes the second surface of the via.

2. The IC device according to claim 1, wherein the first lamella and the second lamella comprise a same polymer.

3. The IC device according to claim 2, wherein the same polymer is includes at least one of polyethylene, polystyrene, polyvinylchloride, polytetrafluorethylene, polydimethylsiloxane, some polyesters, some polyurethanes, acrylics, epoxies, P(t-Butyl Acrylate), polyacrylic acid, polyacrylamide, maleic anhydride polymers, polyethylene, polypropylene, polyacrylonitrile, polybutadiene, polyvinyl acetate, polyacetic acid, polybutyl acrylate, polylactic acid, polycaprolactone, poly(ethylene glycol), and polyisoprene.

4. The IC device according to claim 1, wherein the first layer includes a plurality of first sections comprising a first material and a plurality of second sections comprising a second material that is different from the first material, and the via is in a portion of the second layer that adjoins one of the first sections of the first layer.

5. The IC device according to claim 4, wherein the first material is a dielectric material, and the second material is a metal or a metal compound.

6. The IC device according to claim 4, wherein the first material is a resist material, and the second material is a non-resist material.

7. The IC device according to claim 1, wherein an orientation of the lamellar structures is perpendicular to a surface of the first layer.

8. The IC device according to claim 1, wherein a ratio of a length of the lamellar structures along a direction perpendicular to the surface of the second layer to a length of the via along the direction is in a range from 0.3 to 2.0.

9. The IC device according to claim 1, wherein the plurality of lamellar structures are based on the triblock copolymer in a lamellar phase.

10. The IC device according to claim 1, wherein the via is a through via, a buried via, or a blind via.

* * * * *